(12) United States Patent
Chou et al.

(10) Patent No.: US 10,991,669 B2
(45) Date of Patent: Apr. 27, 2021

(54) SEMICONDUCTOR PACKAGE USING FLIP-CHIP TECHNOLOGY

(71) Applicant: MediaTek Inc., Hsin-Chu (TW)

(72) Inventors: Che-Ya Chou, Kaohsiung (TW); Wen-Sung Hsu, Zhubei (TW); Nan-Cheng Chen, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/238,454

(22) Filed: Aug. 16, 2016

(65) Prior Publication Data
US 2016/0358877 A1 Dec. 8, 2016

Related U.S. Application Data

(60) Continuation-in-part of application No. 14/173,976, filed on Feb. 6, 2014, now Pat. No. 10,573,615, which
(Continued)

(51) Int. Cl.
*H01L 23/00* (2006.01)
*H01L 23/31* (2006.01)
(Continued)

(52) U.S. Cl.
CPC .......... *H01L 24/16* (2013.01); *H01L 23/3128* (2013.01); *H01L 23/3675* (2013.01);
(Continued)

(58) Field of Classification Search
CPC ......... H01L 24/11; H01L 24/13; H01L 24/16; H01L 24/81; H01L 2201/09472; H01L 2201/10674; H01L 2224/16237
See application file for complete search history.

(56) References Cited

U.S. PATENT DOCUMENTS 3,925,297 A 12/1975 Sprengling
6,093,972 A 7/2000 Carney et al.
(Continued)

FOREIGN PATENT DOCUMENTS

CN 101286491 A 10/2008
CN 101477971 7/2009
(Continued)

OTHER PUBLICATIONS

Chinese language office action dated Sep. 6, 2015, issued in application No. CN 201310286640.9.
(Continued)

*Primary Examiner* — Marcos D. Pizarro
(74) *Attorney, Agent, or Firm* — Wolf, Greenfield & Sacks, P.C.

(57) ABSTRACT

A semiconductor package is provided. The semiconductor package includes a semiconductor device bonded to a base through a first conductive structure. The semiconductor device includes a carrier substrate including a conductive trace. A portion of the conductive trace is elongated. The semiconductor device also includes a second conductive structure above the carrier substrate. A portion of the second conductive structure is in contact with the portion of the conductive trace. The semiconductor device further includes a semiconductor body mounted above the conductive trace. The semiconductor body is connected to the second conductive structure.

23 Claims, 21 Drawing Sheets

Related U.S. Application Data is a division of application No. 13/721,983, filed on Dec. 20, 2012, now Pat. No. 9,177,899.

(60) Provisional application No. 62/219,247, filed on Sep. 16, 2015, provisional application No. 61/677,835, filed on Jul. 31, 2012.

(51) Int. Cl.
*H01L 23/498* (2006.01)
*H01L 23/367* (2006.01)
*H01L 25/065* (2006.01)
*H05K 1/11* (2006.01)
*H05K 3/34* (2006.01)

(52) U.S. Cl.
CPC ...... *H01L 23/498* (2013.01); *H01L 23/49827* (2013.01); *H01L 24/13* (2013.01); *H01L 25/0655* (2013.01); *H01L 25/0657* (2013.01); *H05K 1/111* (2013.01); *H01L 23/49811* (2013.01); *H01L 23/49816* (2013.01); *H01L 24/11* (2013.01); *H01L 24/81* (2013.01); *H01L 2224/02166* (2013.01); *H01L 2224/0345* (2013.01); *H01L 2224/0346* (2013.01); *H01L 2224/0401* (2013.01); *H01L 2224/05022* (2013.01); *H01L 2224/05073* (2013.01); *H01L 2224/05124* (2013.01); *H01L 2224/05147* (2013.01); *H01L 2224/05562* (2013.01); *H01L 2224/05572* (2013.01); *H01L 2224/05573* (2013.01); *H01L 2224/05647* (2013.01); *H01L 2224/05666* (2013.01); *H01L 2224/11462* (2013.01); *H01L 2224/11849* (2013.01); *H01L 2224/131* (2013.01); *H01L 2224/1308* (2013.01); *H01L 2224/13083* (2013.01); *H01L 2224/13147* (2013.01); *H01L 2224/13155* (2013.01); *H01L 2224/16235* (2013.01); *H01L 2224/16237* (2013.01); *H01L 2224/16238* (2013.01); *H01L 2224/73204* (2013.01); *H01L 2224/81191* (2013.01); *H01L 2224/81815* (2013.01); *H01L 2225/0651* (2013.01); *H01L 2225/06517* (2013.01); *H01L 2225/06548* (2013.01); *H01L 2225/06586* (2013.01); *H01L 2225/06589* (2013.01); *H01L 2924/00014* (2013.01); *H01L 2924/12042* (2013.01); *H05K 3/3436* (2013.01); *H05K 2201/0376* (2013.01); *H05K 2201/09472* (2013.01); *H05K 2201/10674* (2013.01); *Y02P 70/50* (2015.11)

(56) References Cited

U.S. PATENT DOCUMENTS

| | | | |
|---|---|---|---|
| 6,510,976 | B2 | 1/2003 | Hwee et al. |
| 6,550,666 | B2 | 4/2003 | Chew et al. |
| 6,734,039 | B2 | 5/2004 | Tan et al. |
| 6,750,082 | B2 | 6/2004 | Briar et al. |
| 6,929,981 | B2 | 8/2005 | Tan et al. |
| 7,456,496 | B2 | 11/2008 | Tan et al. |
| 7,462,942 | B2 | 12/2008 | Tan et al. |
| 7,589,398 | B1 | 9/2009 | Huemoeller et al. |
| 7,791,211 | B2 | 9/2010 | Chen et al. |
| 7,795,071 | B2 | 9/2010 | Chew et al. |
| 8,017,442 | B2 | 9/2011 | Hsu |
| 7,939,939 | B1 | 10/2011 | Zeng et al. |
| 8,058,105 | B2 | 11/2011 | Hsu |
| 8,148,822 | B2 | 4/2012 | Lin et al. |
| 8,207,608 | B2 | 6/2012 | Chew et al. |
| 8,288,871 | B1 | 10/2012 | Shieh et al. |
| 9,177,899 | B2 | 11/2015 | Lin et al. |
| 2002/0092672 | A1* | 7/2002 | Primavera ............ H05K 1/111 174/250 |
| 2002/0105789 | A1 | 8/2002 | Chen et al. |
| 2003/0193094 | A1 | 10/2003 | Takahashi et al. |
| 2004/0053483 | A1 | 3/2004 | Nair et al. |
| 2004/0077124 | A1 | 4/2004 | Ogawa |
| 2004/0108580 | A1 | 6/2004 | Tan et al. |
| 2004/0154162 | A1 | 8/2004 | Lee et al. |
| 2005/0001329 | A1 | 1/2005 | Matsuki et al. |
| 2005/0087883 | A1 | 4/2005 | Hwee et al. |
| 2006/0060937 | A1 | 3/2006 | Lim et al. |
| 2006/0103016 | A1 | 5/2006 | Tan et al. |
| 2006/0121256 | A1 | 6/2006 | Kim et al. |
| 2006/0180888 | A1 | 8/2006 | Tan et al. |
| 2006/0186524 | A1 | 8/2006 | Aiba et al. |
| 2006/0192287 | A1 | 8/2006 | Ogawa et al. |
| 2006/0216860 | A1 | 9/2006 | Pendse |
| 2007/0196979 | A1 | 8/2007 | Tan et al. |
| 2007/0284420 | A1 | 12/2007 | Tan et al. |
| 2008/0145967 | A1 | 6/2008 | Chew et al. |
| 2008/0150107 | A1 | 6/2008 | Tan et al. |
| 2008/0150561 | A1 | 6/2008 | Chew et al. |
| 2008/0246146 | A1 | 10/2008 | Kodani et al. |
| 2008/0248610 | A1 | 10/2008 | Hwee et al. |
| 2009/0079094 | A1 | 3/2009 | Lin |
| 2009/0102043 | A1 | 4/2009 | Chew et al. |
| 2009/0166849 | A1 | 7/2009 | Jao et al. |
| 2009/0250811 | A1 | 10/2009 | Pendse |
| 2009/0291530 | A1 | 11/2009 | Chew et al. |
| 2010/0073894 | A1 | 3/2010 | Mortensen et al. |
| 2010/0105173 | A1 | 4/2010 | Fujimori |
| 2010/0147574 | A1 | 6/2010 | Kaneko et al. |
| 2010/0175917 | A1 | 7/2010 | Miyasaka et al. |
| 2010/0258953 | A1 | 10/2010 | Takeda |
| 2010/0264526 | A1 | 10/2010 | Chew et al. |
| 2011/0049708 | A1 | 3/2011 | Lim et al. |
| 2011/0097850 | A1 | 4/2011 | Hsu |
| 2011/0101526 | A1 | 5/2011 | Hsiao et al. |
| 2011/0133334 | A1 | 6/2011 | Pendse |
| 2011/0133342 | A1 | 6/2011 | Arai |
| 2011/0169164 | A1 | 7/2011 | Nakamura et al. |
| 2011/0177686 | A1 | 7/2011 | Zeng et al. |
| 2011/0248399 | A1* | 10/2011 | Pendse ............ H01L 21/563 257/737 |
| 2011/0267789 | A1 | 11/2011 | Chew et al. |
| 2011/0304058 | A1 | 12/2011 | Pendse |
| 2012/0058604 | A1 | 3/2012 | Chew et al. |
| 2012/0220118 | A1 | 8/2012 | Chew et al. |
| 2012/0228780 | A1* | 9/2012 | Kim ............ H01L 23/36 257/774 |
| 2012/0267779 | A1* | 10/2012 | Lin ............ H01L 24/11 257/737 |
| 2012/0286423 | A1 | 11/2012 | Cheng et al. |
| 2012/0326299 | A1 | 12/2012 | Topacio et al. |
| 2013/0020710 | A1 | 1/2013 | Chew et al. |
| 2013/0062755 | A1* | 3/2013 | Kuo ............ H01L 24/14 257/737 |
| 2013/0087366 | A1 | 4/2013 | Michael et al. |
| 2013/0093076 | A1 | 4/2013 | Lin et al. |
| 2013/0113099 | A1 | 5/2013 | Lim et al. |
| 2013/0127054 | A1 | 5/2013 | Muthukumar et al. |
| 2013/0161776 | A1* | 6/2013 | Iizuka ............ H01L 31/0203 257/433 |
| 2013/0161809 | A1 | 6/2013 | Chew et al. |
| 2013/0175707 | A1 | 7/2013 | Chew et al. |
| 2014/0035095 | A1 | 2/2014 | Lin et al. |
| 2014/0131856 | A1* | 5/2014 | Do ............ H01L 21/56 257/737 |
| 2014/0151867 | A1 | 6/2014 | Lin et al. |
| 2014/0191396 | A1 | 7/2014 | Lin et al. |
| 2015/0061143 | A1 | 3/2015 | Kim et al. |
| 2015/0145131 | A1 | 5/2015 | Yoo et al. |
| 2016/0307861 | A1 | 10/2016 | Lin et al. |

(56) References Cited

U.S. PATENT DOCUMENTS

2016/0358877 A1 12/2016 Chou et al.
2017/0133310 A1 5/2017 Kelly

FOREIGN PATENT DOCUMENTS

| CN | 100530608 C | 8/2009 |
| --- | --- | --- |
| CN | 101728337 A | 6/2010 |
| CN | 101958289 | 1/2011 |
| CN | 102054811 | 5/2011 |
| CN | 102760712 | 10/2012 |
| CN | 103579169 A | 2/2014 |
| CN | 104904006 A | 9/2015 |
| JP | H05-267393 A | 10/1993 |
| KR | 10-2007-0107154 A | 11/2007 |
| KR | 10-2010-0033953 A | 3/2010 |
| KR | 10-2011-0047127 A | 5/2011 |
| KR | 10-2011-0135329 A | 12/2011 |
| TW | 200623997 | 7/2006 |
| TW | 200915452 | 4/2009 |
| TW | 200915452 A | 4/2009 |
| TW | 200929467 | 7/2009 |
| TW | 201042744 | 12/2010 |
| TW | 201115655 | 5/2011 |
| TW | I364101 | 5/2012 |
| TW | 201222752 | 6/2012 |
| TW | 201405728 A | 2/2014 |
| TW | 201430967 A | 8/2014 |
| TW | 201523835 A | 6/2015 |
| WO | WO 0223631 A2 | 3/2002 |
| WO | WO 2016/094721 A1 | 6/2016 |

OTHER PUBLICATIONS

Chinese language office action dated Dec. 17, 2015, issued in application No. TW 10421708800.
Third-Party Pre-Issuance Submission filed by a third party in the present application on or about Aug. 5, 2015; pp. 1-14.
Chen et al., CU Pillar Bump-on-Trace (BoT) Design for Ultra Low-K Packaging, 8th International Microsystems, Packaging, Assembly and Circuits Technology Conference (IMPACT), IEEE, Oct. 22, 2013, pp. 341-344.
Koh et al., Copper Pillar Bump Technology Progress Overview, 12th International Conference on Electronic Packaging Technology and High Density Packaging, Aug. 1, 2011, pp. 1137-1137.
Extended European Search Report for Application No. EP 13863897.8 dated Jul. 28, 2016.
Office Action dated Jul. 26, 2016 from Korean application No. 10-2015-7019713.
Lutzow et al., Recyclable Anistropic Etchant for Advanced Flip Chip Manufacturing (Green). Microsystems, Packaging, Assembly and Circuits Technology Conference. Oct. 2012: 110-3.
Quirk et al., Semiconductor Manufacturing Technology. 2001. Chapter 16, p. 438 Prentice Hall Inc.
International Search Report and Written Opinion dated Mar. 27, 2014 in connection with International Application No. PCT/CN2013/089940.
PCT/CN2013/089940, Mar. 27, 2014, International Search Report and Written Opinion.
U.S. Appl. No. 14/173,976, filed Feb. 6, 2014, Lin et al.
U.S. Appl. No. 14/205,880, filed Mar. 12, 2014, Lin et al.
U.S. Appl. No. 15/194,658, filed Jun. 28, 2016, Lin et al.
EP 13863897.8, Jul. 28, 2016, Extended European Search Report.
EP Serial Application No. 20209680.6, dated Feb. 22, 2021, Extended European Search Report.
Extended European Search Report for European Application No. EP 20209680.6 dated Feb. 22, 2021.

\* cited by examiner

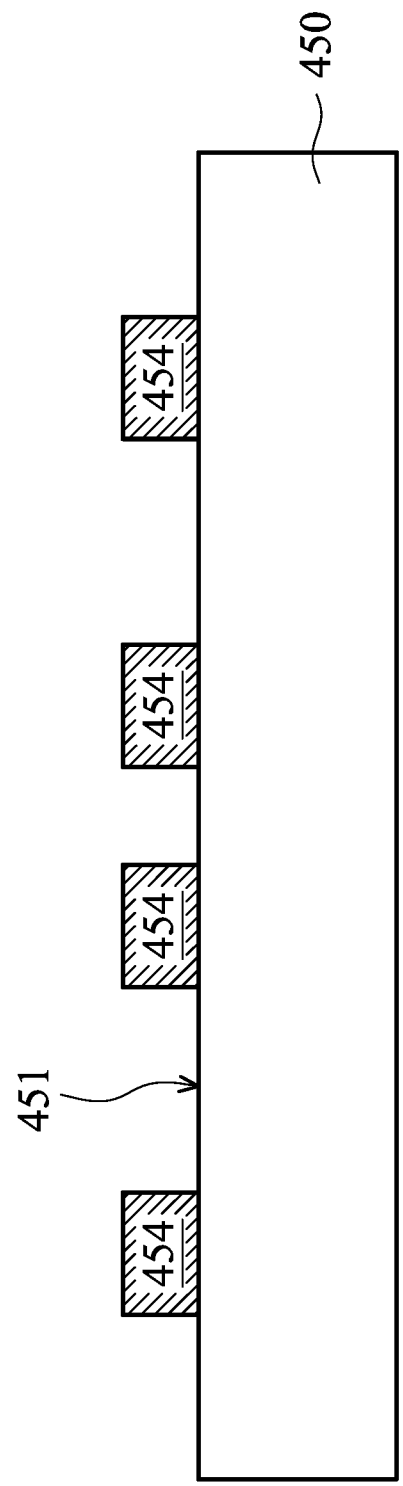

SEMICONDUCTOR PACKAGE USING FLIP-CHIP TECHNOLOGY

CROSS REFERENCE TO RELATED APPLICATIONS

This Application claims the benefit of U.S. Provisional Application No. 62/219,247, filed Sep. 16, 2015 and is a Continuation-In-Part of pending U.S. patent application Ser. No. 14/173,976, filed Feb. 6, 2014, which is a Division of U.S. patent application Ser. No. 13/721,983, filed Dec. 20, 2012 (now U.S. Pat. No. 9,177,899) which claims the benefit of U.S. Provisional Application No. 61/677,835, filed Jul. 31, 2012, the entirety of which are incorporated by reference herein.

BACKGROUND OF THE INVENTION

Field of the Invention

The present invention relates to a semiconductor package, and in particular to a semiconductor package using flip-chip technology.

Description of the Related Art

In order to ensure the miniaturization and multi-functionality of electronic products and communication devices (such as wearable devices), it is desired that semiconductor packages be small in size, support multi-pin connection, operate at high speeds, and provide high functionality. The demand for increasing Input-Output (I/O) pin counts and high-performance integrated circuits (ICs) has led to the development of flip-chip technology. The flip-chip technology uses bumps on a chip/die to interconnect to a substrate, such as a printed circuit board (PCB). The chip is flipped and bonded face down to the substrate. The flip-chip technology achieves a high density interconnection with devices.

However, as the size of a chip becomes smaller, line widths and pitches of the PCB are required to be minimized further. As a result, the process of fabricating the PCB becomes more difficult and complicated. The PCB also needs to be made of a particular material suitable for fine layout. Accordingly, it is hard to reduce the fabrication cost of the PCB and the semiconductor package including the PCB.

Thus, a novel semiconductor package, which uses flip-chip technology and has a lower fabrication cost, is desirable.

BRIEF SUMMARY OF THE INVENTION

An exemplary embodiment of a semiconductor package includes a semiconductor device bonded to a base through a first conductive structure. The semiconductor device includes a carrier substrate including a conductive trace. A portion of the conductive trace is elongated. The semiconductor device also includes a second conductive structure above the carrier substrate. A portion of the second conductive structure is in contact with the portion of the conductive trace. The semiconductor device further includes a semiconductor body mounted above the conductive trace. The semiconductor body is connected to the second conductive structure.

An exemplary embodiment of a semiconductor package includes a semiconductor device bonded to a base through a first conductive structure. The semiconductor device includes a carrier substrate including a first conductive trace. The semiconductor device also includes a second conductive structure above the carrier substrate. A portion of the second conductive structure is in contact with the first conductive trace. The semiconductor device further includes a semiconductor die mounted above the first conductive trace. A pad of the semiconductor die is connected to the second conductive structure and is wider than the first conductive trace.

An exemplary embodiment of a semiconductor package includes a semiconductor device bonded to a base through first conductive structures. The semiconductor device includes a carrier substrate including a conductive trace. The conductive trace is elongated and carries a signal or ground across at least a portion of the carrier substrate. The semiconductor device also includes second conductive structures above the carrier substrate. One of the second conductive structures is in contact with the conductive trace. The semiconductor device further includes a semiconductor die mounted above the conductive trace. The semiconductor die is connected to the second conductive structures.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 6A to 6E are cross-sectional views of various stages of a process for forming a semiconductor package, in accordance with some embodiments.

DETAILED DESCRIPTION OF THE INVENTION

Figure 1:
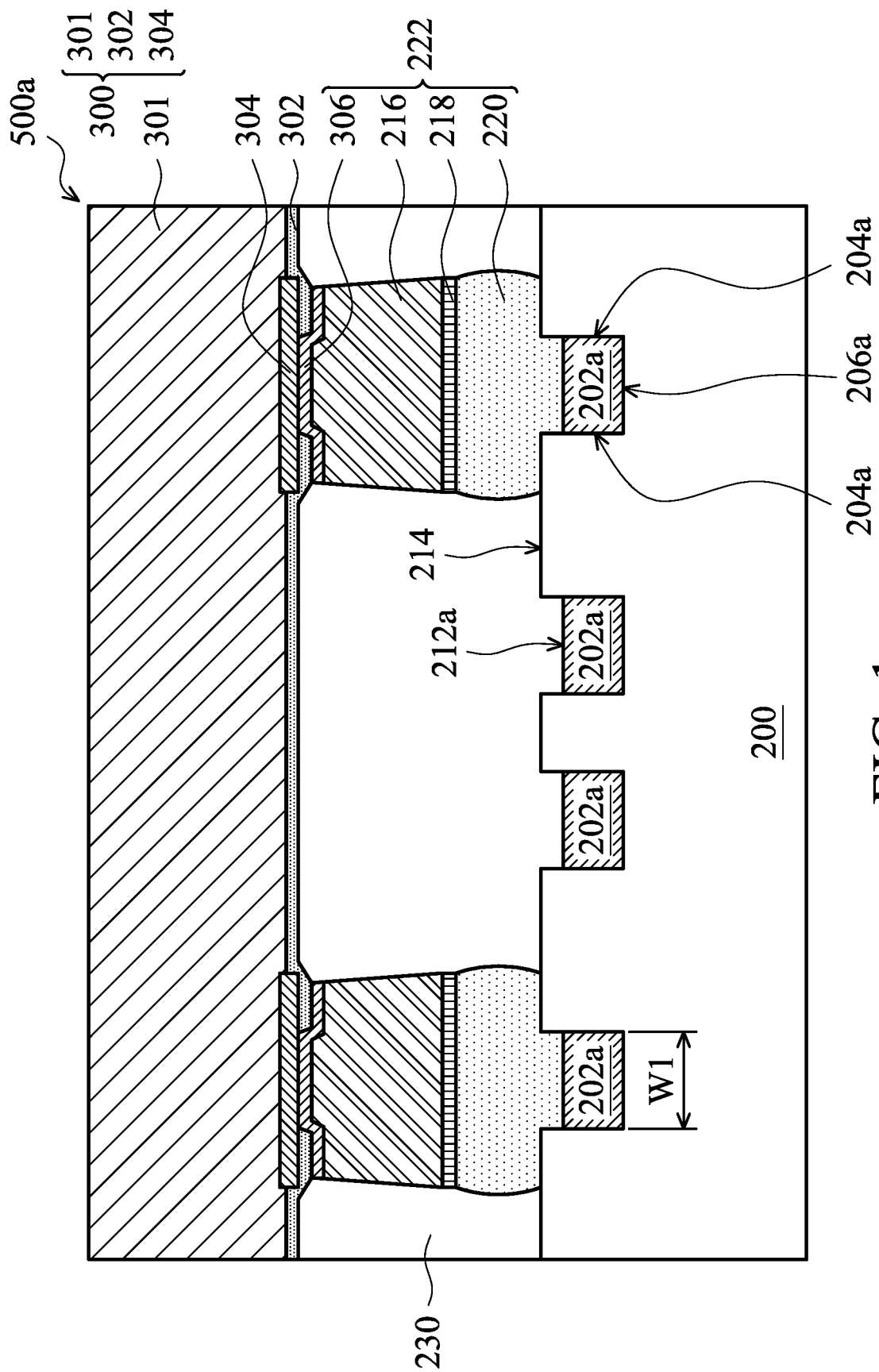
FIGS. 1 to 4 are cross-sectional views of various exemplary embodiments of a semiconductor package.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIGS. 1 to 4 are cross-sectional views of various exemplary embodiments of a semiconductor package. In some embodiments, the semiconductor package is a flip-chip package using conductive structures connecting a semiconductor device to a base. Alternatively, the semiconductor package may be a package using wire bonding technology to connect a semiconductor device to a base.

For example, the conductive structures may be solder bumps, copper pillar bumps, or other suitable conductive structures. The semiconductor device may be a semiconductor chip/die or a semiconductor package including a semiconductor die. The base may be a printed circuit board (PCB) or another suitable substrate.

FIG. 1 is a cross-sectional view of a semiconductor package 500a, in accordance with some embodiments. As shown in FIG. 1, the semiconductor package 500a comprises a base 200 having a device-attached surface 214. In some embodiments, the base 200, such as a PCB, may be formed of polypropylene (PP) or another suitable material. It should be noted that the base 200 may be a single layer or a multilayer structure.

A plurality of conductive traces 202a is embedded in the base 200. In some embodiments, the conductive traces 202a may comprise signal trace segments or ground trace segments. The signal trace segments or ground trace segments are used for input/output (I/O) connections of a semiconductor device 300 mounted directly onto the base 200. In other words, the conductive traces 202a carry signals or ground across at least a portion of the base 200. Therefore, each of the conductive traces 202a has at least one portion serving as an external connecting region of the base 200.

In some embodiments, the conductive traces 202a are designed to have a width which is larger than 5 µm, such as in a range from 10 µm to 20 µm. However, it should be noted that there is no limitation on the width of the conductive traces 202a. For different designs, the width of the conductive traces 202a can be smaller than 5 µm or another suitable value if required. In some embodiments, the length of the conductive traces 202a is much greater than its width. Therefore, the conductive traces 202a are elongated lines or stripes.

In contrast, a pad structure is stout. For example, a width of a pad structure is about 100 µm or greater than 100 µm. A pad structure is typically configured in a square, oval or polygon shape. Accordingly, the area of a pad structure in a predetermined size is much larger than that of the conductive traces 202a in the predetermined size. Also, the shape of the conductive traces 202a is much different than that of a pad structure. It should be noted that the conductive traces 202a are fundamentally distinct in shape and area compared to a pad structure.

More specifically, since the conductive traces 202a is elongated and the width of the conductive traces 202a is much smaller than that of a pad structure, the conductive traces 202a endure less bonding stress than a bonding structure on a pad structure. The conductive traces 202a are much narrower than a pad structure so it allows denser pitches and more traces within the same area than a pad structure. Consequently, the conductive traces 202a have higher I/O density than a pad structure. More I/O connections per IC provide higher device performance. Smaller and closer spaced connections meet the requirement of miniaturization.

Furthermore, the conductive traces 202a provide better layout density of the base 200 than a pad structure, so that package size is reduced as well as the number of layers of the base 200 (such as being able to require 2 to 4 conductive layers instead of 6), which lowers fabrication cost. It should be also noted that the conductive traces 202a are fundamentally different from a pad structure in regard to stress endurance, I/O density, and fabrication cost.

A semiconductor device 300 is mounted on the device-attached surface 214 of the base 200 with an active surface of the semiconductor device 300 facing the base 200 by a bonding process. In some embodiments, the semiconductor device 300 may comprise a die, a passive component, a package or a wafer level package. In some embodiments, the semiconductor device 300 is a flip-chip package. The circuitry of the semiconductor device 300 is disposed on the active surface, and conductive pads 304 are disposed on the top of the circuitry. The circuitry of the semiconductor device 300 is interconnected to the circuitry of the base 200 via a plurality of conductive structures 222 disposed on the active surface of the semiconductor device 300.

As shown in FIG. 1, the semiconductor device 300 may include a semiconductor body 301, conductive pads 304 overlying the semiconductor body 301, and an insulation layer 302 covering the conductive pads 304. In some embodiments, the semiconductor body 301 may include but is not limited to a semiconductor substrate, circuit elements fabricated on the main surface of the semiconductor substrate, inter-layer dielectric (ILD) layers and an interconnection structure. In some embodiments, the interconnection structure may comprise a plurality of metal layers, a plurality of dielectric layers alternatively laminated with the metal layers and a plurality of vias formed through the dielectric layers on the semiconductor body 301. The semiconductor body 301 may be referred to as a semiconductor die.

The conductive pads 304 comprise the topmost metal layer of the metal layers of the interconnection structure. In some embodiments, the conductive pads 304 may comprise but is not limited to aluminum, copper or alloys thereof. In some embodiments, the insulation layer 302 may be a single layer structure or a multilayer structure. In some embodiments, the insulation layer 302 may comprise but is not limited to silicon nitride, silicon oxide, silicon oxynitride, polyimide or any combination thereof Also, the insulation layer 302 may have such functions as stress buffering and insulation. A plurality of openings may be formed in the insulation layer 302. Each of the openings exposes at least a portion of one of the conductive pads 304. The conductive pads 304 are different from the conductive traces 202a in regard to shape, area, stress endurance, I/O density, and fabrication cost.

In some embodiments, the conductive structures 222 may comprise conductive bump structures such as solder bumps, copper bumps, conductive wire structures, or conductive paste structures. In some embodiments, the conductive structures 222 may be a copper bump structure composed of a metal stack comprising an UBM (under bump metallurgy) layer 306, a copper layer 216, a conductive buffer layer 218, and a solder cap 220. However, it should be noted that the conductive structures 222 shown in FIG. 1 are only an example and are not a limitation to the present invention.

In some embodiments, the UBM layer 306 can be formed on the exposed conductive pads 304 within the openings in the insulation layer 302 by a deposition method, such as a sputtering or plating method and a subsequent anisotropic etching process. The anisotropic etching process is performed after forming conductive pillars. The UBM layer 306 may also extend onto a top surface of the insulation layer 302. In some embodiments, the UBM layer 306 may comprise titanium, copper or a combination thereof.

The copper layer 216 (such as an electroplated copper layer) can be formed on the UBM layer 306. The copper layer 216 may help to increase the mechanical strength of the conductive structures 222. The openings in the insulation layer 302 may be filled with the copper layer 216 and the UBM layer 306. The copper layer 216 and the UBM layer 306 within the openings in the insulation layer 302 may form an integral plug of the conductive structures 222. The formation position of the copper layer 216 is defined by a dry film photoresist or liquid photoresist patterns (not shown).

The solder cap 220 can be formed on the copper layer 216 by electroplating a solder with a patterned photoresist layer or by a screen printing process and a subsequent solder reflow process. In some embodiments, the conductive structures 222, such as a conductive pillar structure, is used as a solder joint for the conductive pads 304, which transmits I/O, ground or power signals of the semiconductor device 300 formed thereon.

The conductive buffer layer 218 may be formed between the copper layer 216 and the solder cap 220 by an electroplating method. The conductive buffer layer 218 may serve as a seed layer, an adhesion layer and a barrier layer for the solder cap 220 formed thereon. The conductive buffer layer 218 may comprise Ni or another suitable material.

In some embodiments, an underfill material 230 may be introduced into the gap between the semiconductor device 300 and the base 200. The underfill material 230 surrounds the conductive structures 222. A portion of the underfill material 230 may be in direct contact with the device-attached surface 214 of the base 200. A portion of the underfill material 230 may extend into the base 200 when the conductive traces 202a are recessed from the device-attached surface 214 of the base 200. In some embodiments, the underfill material 230 may comprises a capillary underfill (CUF), molded underfill (MUF) or a combination thereof.

In some embodiments, conductive traces may have a top surface disposed above, below or aligned to a surface of the base to improve routing ability for high-density semiconductor packages. As shown in FIG. 1, the conductive traces 202a have top surfaces 212a disposed below the device-attached surface 214 of the base 200. That is to say, a bottom surface 206a and a sidewall 204a of the conductive traces 202a are designed to be connected to or in direct contact with the base 200. In some embodiments, the solder cap 220 of the conductive structures 222 is disposed to directly contact with the device-attached surface 214 of the base 200 and the top surface 212a of the conductive traces 202a. Due to the top surface 212a of the conductive traces 202a being recessed from the device-attached surface 214 of the base 200, the solder cap 220 of the conductive structures 222 extends into the base 200. The bump-to-trace space is increased and the problem of bump-to-trace bridging can be effectively avoided.

Figure 2:
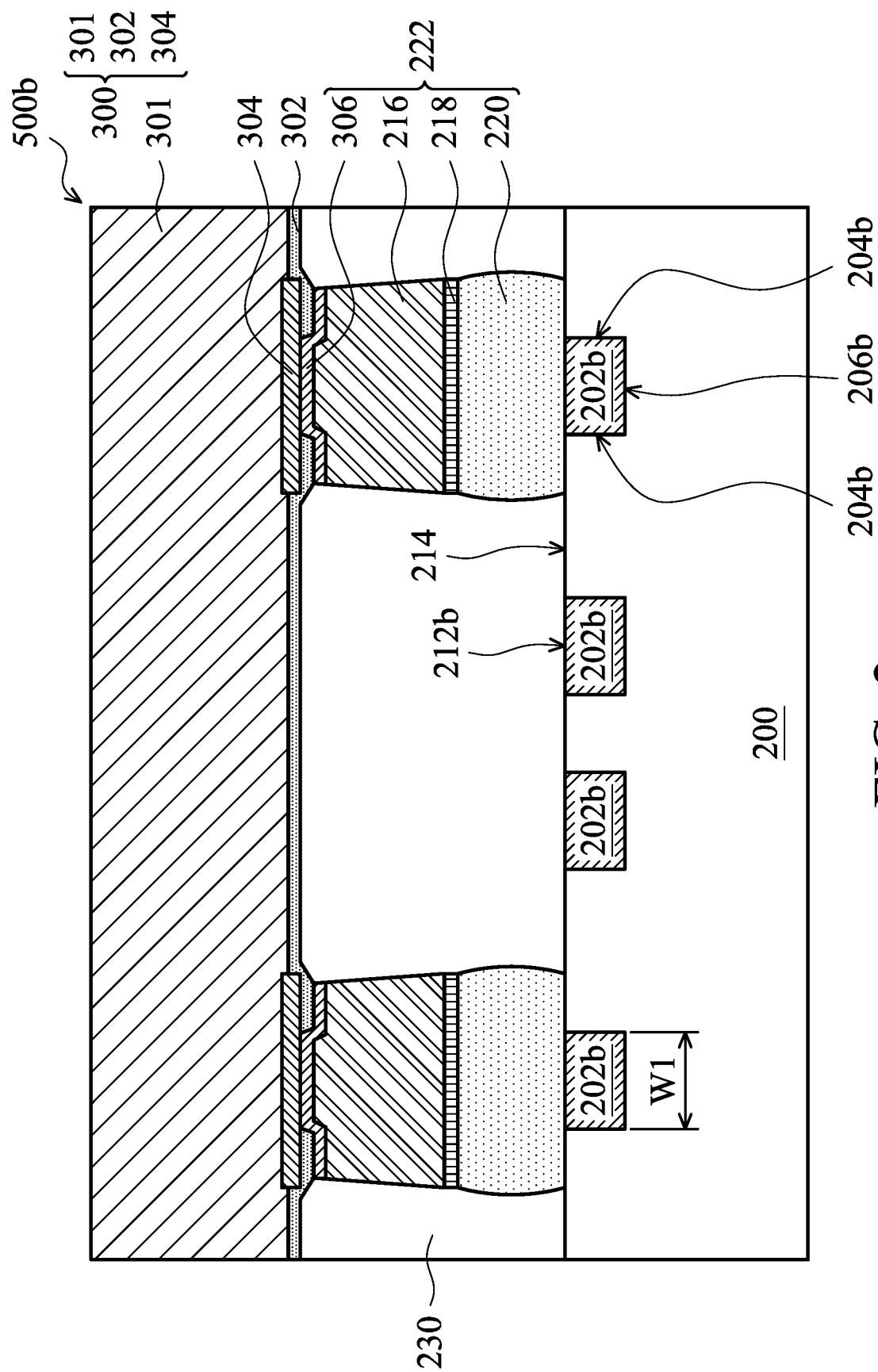

FIG. 2 is a cross-sectional view of a semiconductor package 500b, in accordance with some embodiments. Elements in FIG. 2 that are the same as those in FIG. 1 are labeled with the same reference numbers as in FIG. 1, and are not described again for brevity. In some embodiments, the semiconductor package 500b comprises conductive traces 202b embedded in the base 200. The conductive traces 202b may have a top surface 212b designed to be aligned to the device-attached surface 214 of the base 200 to improve routing ability for high-density semiconductor packages. That is to say, a bottom surface 206b and a sidewall 204b of the conductive traces 202b are designed to be fully connected to the base 200. Therefore, the solder cap 220 of the conductive structures 222 is disposed on the device-attached surface 214 of the base 200, and is in direct contact with the top surface 212b of the conductive traces 202b.

Figure 3:
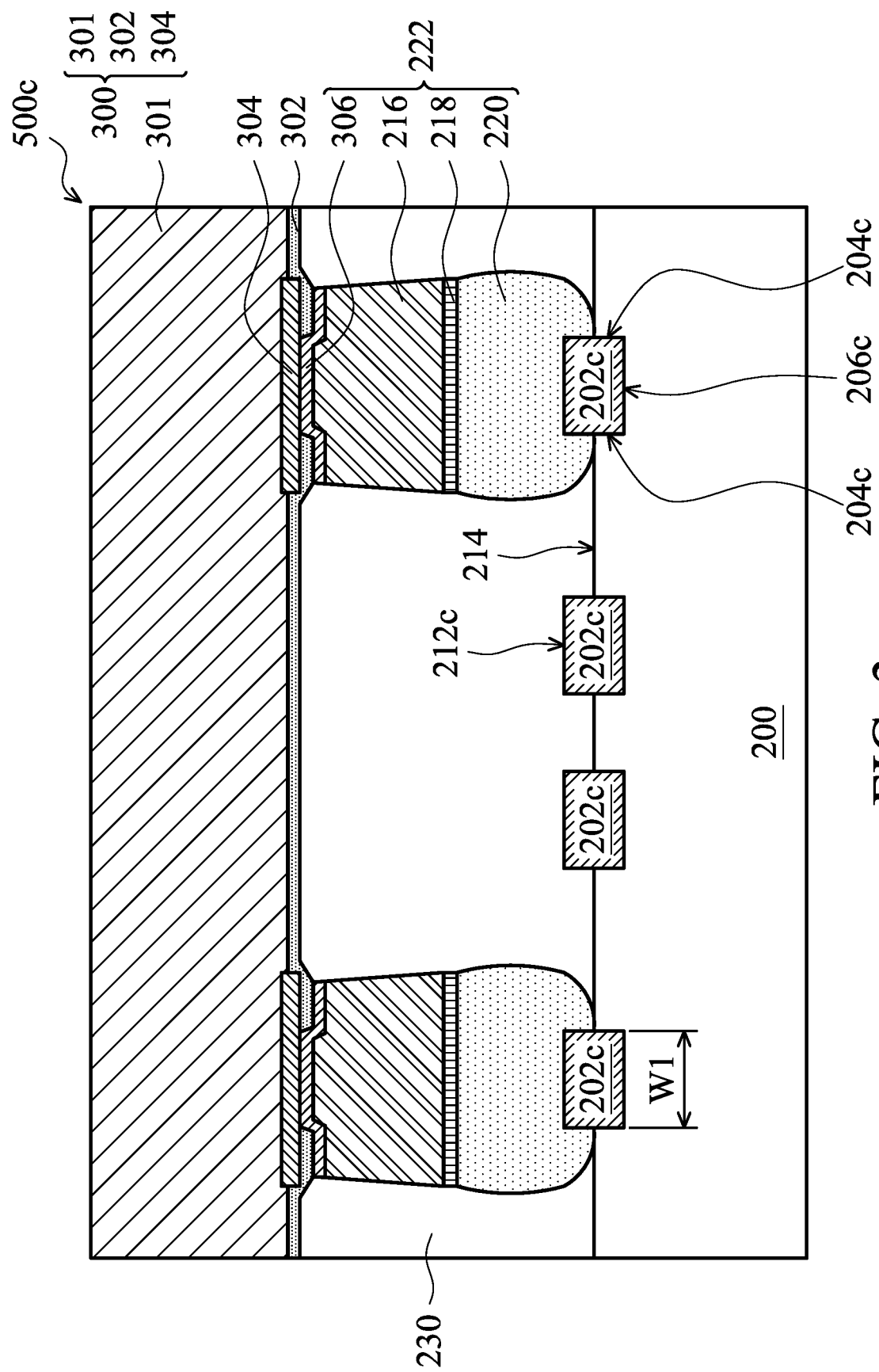

FIG. 3 is a cross-sectional view of a semiconductor package 500c, in accordance with some embodiments. Elements in FIG. 3 that are the same as those in FIGS. 1 and 2 are labeled with the same reference numbers as in FIGS. 1 and 2, and are not described again for brevity. In some embodiments, the semiconductor package 500c comprises conductive traces 202c embedded in the base 200. The conductive traces 202c may have a top surface 212c designed above the device-attached surface 214 of the base 200 to improve routing ability for high-density semiconductor packages. That is to say, a bottom surface 206c and only an upper portion of a sidewall 204c of the conductive traces 202c are designed to be connected to or in direct contact with the base 200. Therefore, the solder cap 220 of the conductive structures 222 is disposed on the device-attached surface 214 of the base 200. The solder cap 220 wraps the top surface 212c and a portion of the sidewall 204c of the conductive traces 202c.

As shown FIGS. 1-3, the base 200 comprises a single layer structure. Alternatively, the base may comprise a multilayer structure. However, embodiments of the disclosure are not limited thereto. In some other embodiments, the base 200 may comprise a multilayer structure.

Figure 4:
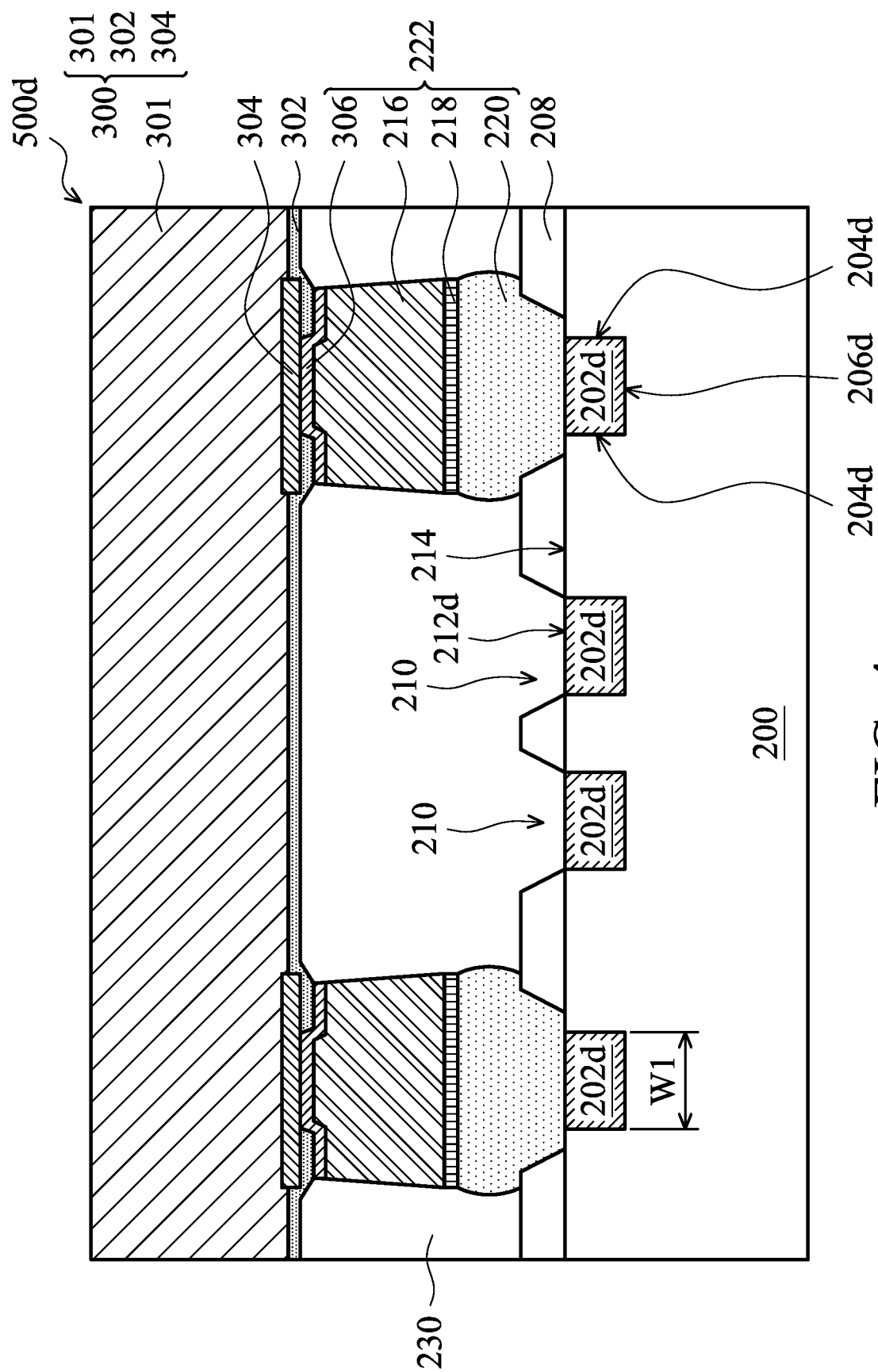

FIG. 4 is a cross-sectional view of a semiconductor package 500d, in accordance with some embodiments. Elements in FIG. 4 that are the same as those in FIGS. 1 to 3 are labeled with the same reference numbers as in FIGS. 1 to 3, and are not described again for brevity. In some embodiments, the semiconductor package 500d comprises conductive traces 202d embedded in the base 200. The conductive traces 202d may have a top surface 212d designed to be aligned to the device-attached surface 214 of the base 200 to improve routing ability for high-density semiconductor packages. That is to say, a bottom surface 206d and a sidewall 204d of the conductive traces 202d are designed to be connected to the base 200. In some embodiments, an insulation layer 208 having openings 210 is disposed on the base 200. The insulation layer 208 is disposed above the device-attached surface 214 and the conductive traces 202d. In some embodiments, the base 200 and the insulation layer 208 collectively serve as a multilayer base.

As shown in FIG. 4, the conductive traces 202d are exposed from the openings 210. The solder cap 220 of the conductive structures 222 is formed on the insulation layer 208 and extends into the openings 210. As a result, the solder cap 220 is in direct contact with a top surface 212d of the conductive traces 202d through the openings 210. It should be noted that it is not necessary for the insulation layer 208 to align with the sidewall 204d of the conductive traces 202d. Instead, it can be designed to be distanced outward or inward from the sidewall 204d of the conductive traces 202d as shown in FIG. 4.

FIGS. 5A to 5E are cross-sectional views of various stages of a process for forming a semiconductor package, in accordance with some embodiments. Elements in FIGS. 5A to 5E that are the same as those in FIGS. 1 to 4 are labeled with the same reference numbers as in FIGS. 1 to 4, and are not described again for brevity. FIGS. 5a to 5e show a method for fabricating two bases 200c and 200d, which is similar to the base 200 of the semiconductor packages 500a, 500b, 500c and 500d. In some embodiments, the method for fabricating the bases 200c and 200d is also called a double-sided base fabricating process.

Figure 5A:
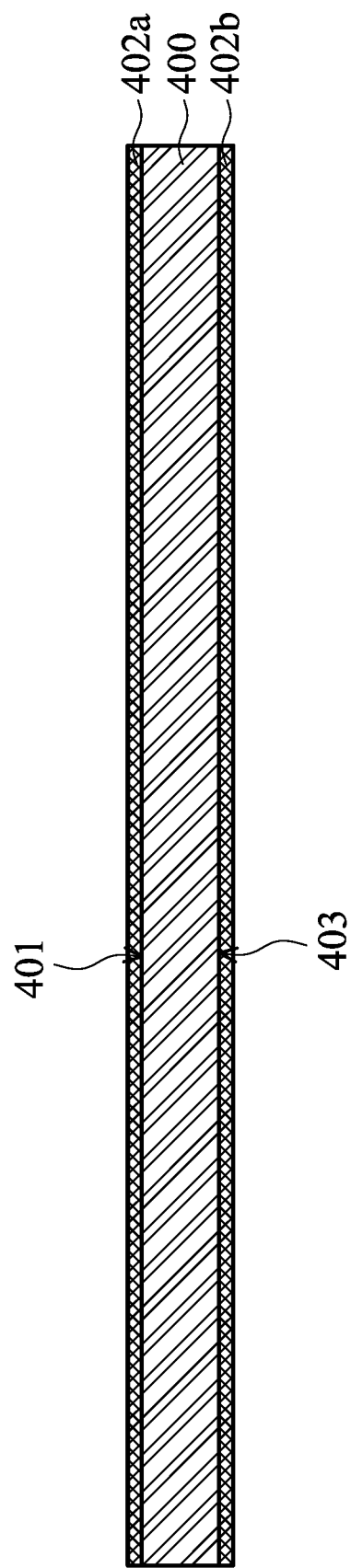
FIGS. 5A to 5E are cross-sectional views of various stages of a process for forming a semiconductor package, in accordance with some embodiments.

As shown in FIG. 5A, a carrier 400 with conductive seed layers 402a and 402b is provided. In some embodiments, the carrier 400 may comprise FR4 glass epoxy, stainless steel or another suitable material. The conductive seed layer 402a is on a top surface 401 of the carrier 400. The conductive seed layer 402b is on a bottom surface 403 of the carrier 400. The conductive seed layers 402a and 402b are used as seed layers for subsequently formed interconnection conductive traces of bases on the top surface 401 and the bottom surface 403 of the carrier 400. In some embodiments, the conductive seed layers 402a and 402b may comprise copper or another suitable material.

Figure 5B:
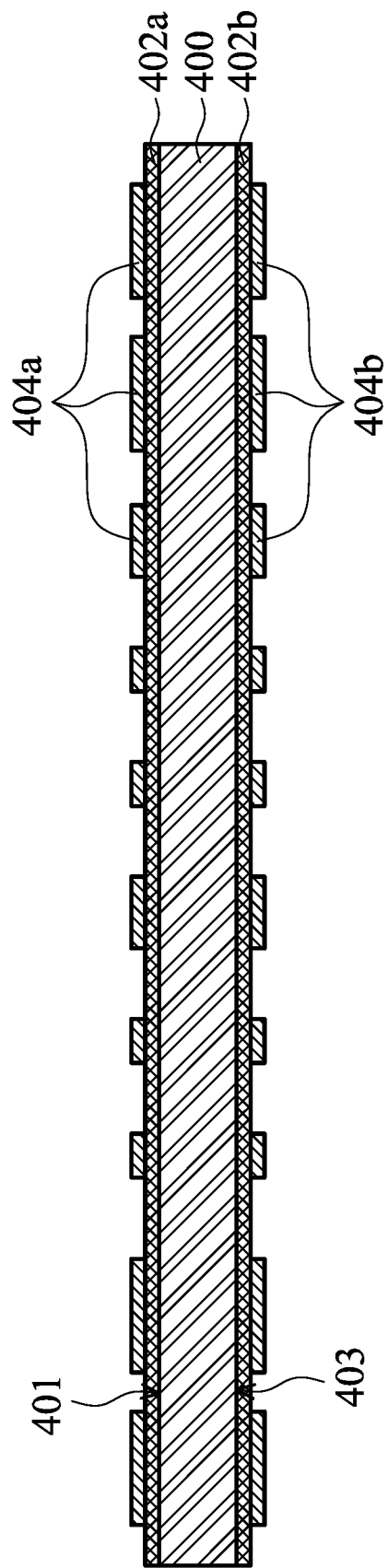

Next, as shown in FIG. 5B, first conductive traces 404a and 404b are respectively formed on the top surface 401 and the bottom surface 403 of the carrier 400. Bottom portions of the first conductive traces 404a and 404b connect to top portions of the conductive seed layers 402a and 402b. In some embodiments, the first conductive traces 404a and 404b may be formed by a plating process and an anisotropic etching process. The plating process and the anisotropic etching process are simultaneously performed on the top surface 401 and the bottom surface 403 of the carrier 400. In some embodiments, the plating process may comprise an electrical plating process.

In some embodiments, the first conductive traces 404a and 404b may comprise copper or another suitable material. In some embodiments, the first conductive traces 404a and 404b are designed to have a width which is larger than 5 µm. However, it should be noted that there is no limitation on the width of the conductive traces. For different designs, the width of the conductive traces can be smaller than 5 µm if required. In some embodiments, the anisotropic etching process may precisely control the width of the first conductive traces 404a and 404b.

Figure 5C:
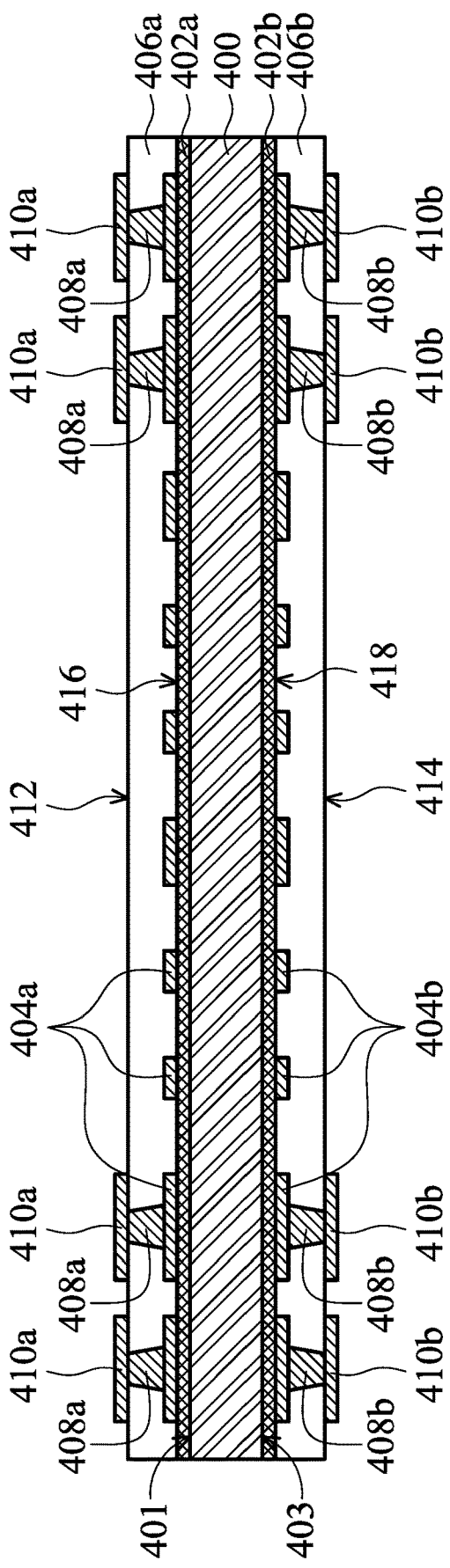

Next, as shown in FIG. 5C, a laminating process is performed to respectively dispose a first base material layer 406a and a second base material layer 406b on the top surface 401 and the bottom surface 403 of the carrier 400. The first base material layer 406a and the second base material layer 406b respectively cover the first conductive traces 404a and 404b. In some embodiments, the laminating process for forming the first base material layer 406a and the second base material layer 406b is simultaneously performed on the top surface 401 and the bottom surface 403 of the carrier 400. In some embodiments, the first base material layer 406a and the second base material layer 406b may comprise polypropylene (PP) or another suitable material.

Afterwards, as shown in FIG. 5C, a drilling process is performed to form openings penetrating through the first base material layer 406a and the second base material layer 406b to define the formation position of subsequently formed vias 408a and 408b. In some embodiments, the drilling process may comprise a laser drilling process, an etching drilling process or a mechanical drilling process. In some embodiments, the drilling process is simultaneously performed on the first base material layer 406a and the second base material layer 406b.

Next, a plating process is performed to fill a conductive material into the openings to form the vias 408a and 408b on the top surface 401 and the bottom surface 403, respectively. The vias 408a and 408b are used to interconnect the first conductive traces 404a and 404b to subsequent second conductive traces 410a and 410b. In some embodiments, the plating process is simultaneously performed on the first base material layer 406a and the second base material layer 406b.

Subsequently, as shown in FIG. 5C, the second conductive traces 410a and 410b are respectively formed on a first surface 412 of the first base material layer 406a and a first surface 414 of the second base material layer 406b. The first surface 412 of the first base material layer 406a and the first surface 414 of the second base material layer 406b are respectively away from the top surface 401 and the bottom surface 403 of the carrier 400. The second conductive traces 410a and 410b are formed by a plating process and an anisotropic etching process. The plating process and the anisotropic etching process are simultaneously performed on the first surface 412 of the first base material layer 406a and the first surface 414 of the second base material layer 406b. In some embodiments, the plating process may comprise an electrical plating process.

In some embodiments, the second conductive traces 410a and 410b may comprise copper or another suitable material. In some embodiments, the second conductive traces 410a and 410b are designed to have a width which is larger than 5 µm. However, it should be noted that there is no limitation on the width of the conductive traces. For different designs, the width of the conductive traces can be smaller than 5 µm if required. In some embodiments, the anisotropic etching process may precisely control the width of the second conductive traces 410a and 410b.

Figure 5D:
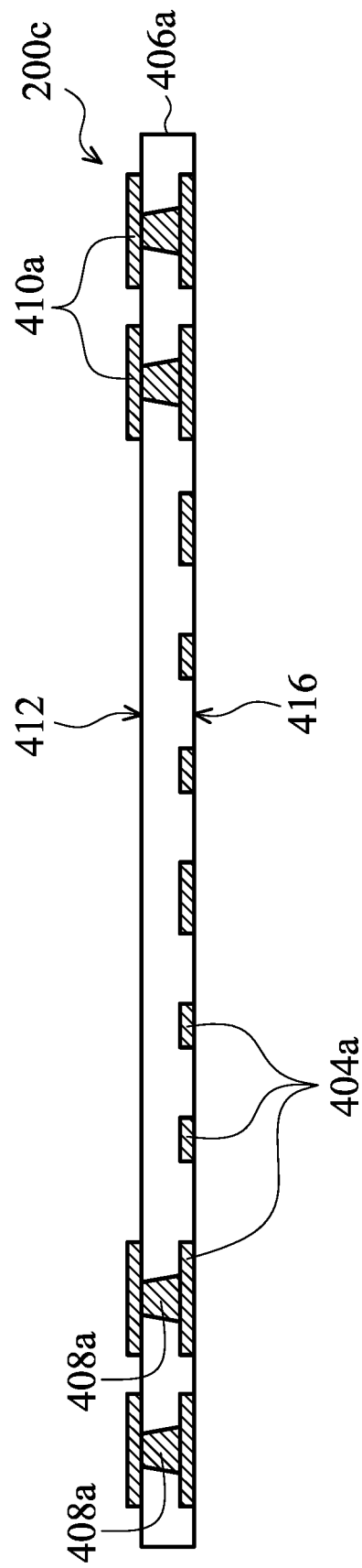
Figure 5E:
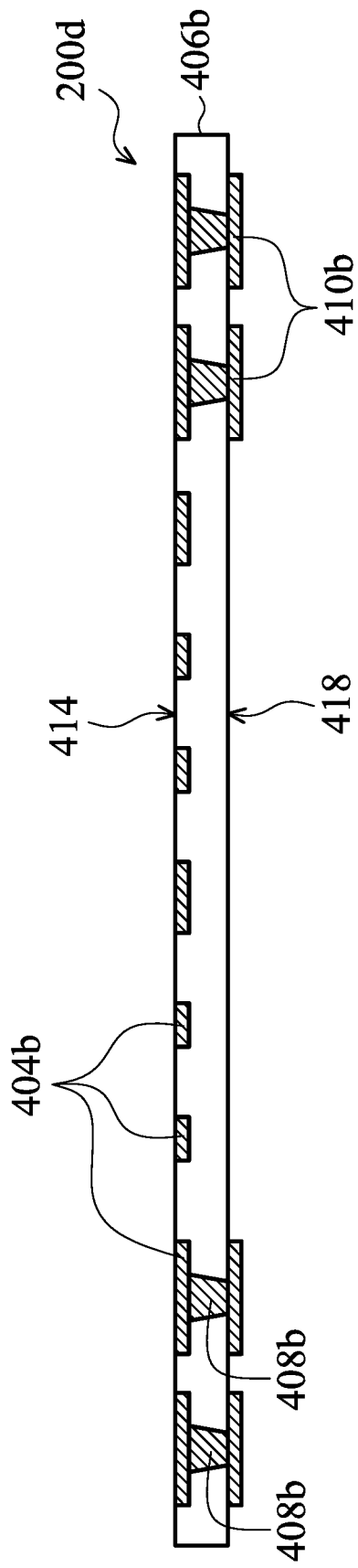

Next, the first base material layer 406a with the first conductive traces 404a therein and the second conductive traces 410a thereon is separated from the top surface 401 of the carrier 400 to form the base 200c, as shown in FIG. 5D. The second base material layer 406b with the first conductive traces 404b therein and the second conductive traces 410b thereon is separated from the bottom surface 403 of the carrier 400 to form the base 200d, as shown in FIG. 5E. The base 200c and 200d are separated from each other. Next, the conductive seed layers 402a is removed from the base 200c, and the conductive seed layers 402b is removed from the base 200d.

As shown in FIG. 5D, the first conductive traces 404a are aligned to a second surface 416 of the base 200c, which is opposite to the first surface 412. As shown in FIG. 5E, the first conductive traces 404b are aligned to a second surface 418 of the base 200d, which is opposite to the first surface 414. In some embodiments, the base 200c and base 200d are simultaneously fabricated on opposite surfaces (the top surface 401 and the bottom surface 403 of the carrier 400) by a double-sided base fabricating process.

Many variations and/or modifications can be made to embodiments of the disclosure. In some other embodiments, a passivation or insulation layer (not shown) having openings may be formed on the second surface 416 of the base 200c after the separation of the base 200c shown in FIG. 5D. Similarly, a passivation or insulation layer (not shown) having openings may be formed on the second surface 418 of the base 200d after the separation of the base 200d shown in FIG. 5E. In some embodiments, the base 200c or 200d and the passivation or insulation layer thereon collectively serve as a multilayer base. The first conductive traces 404a of the base 200c or the first conductive traces 404b of the base 200d are exposed from the openings of the passivation or insulation layer. The position of the passivation or insulation layer with openings and first conductive traces 404a or 404b can be similar to that of the insulation layer 208 with the openings 210 and conductive traces 202d shown in FIG. 4.

Figure 6A:
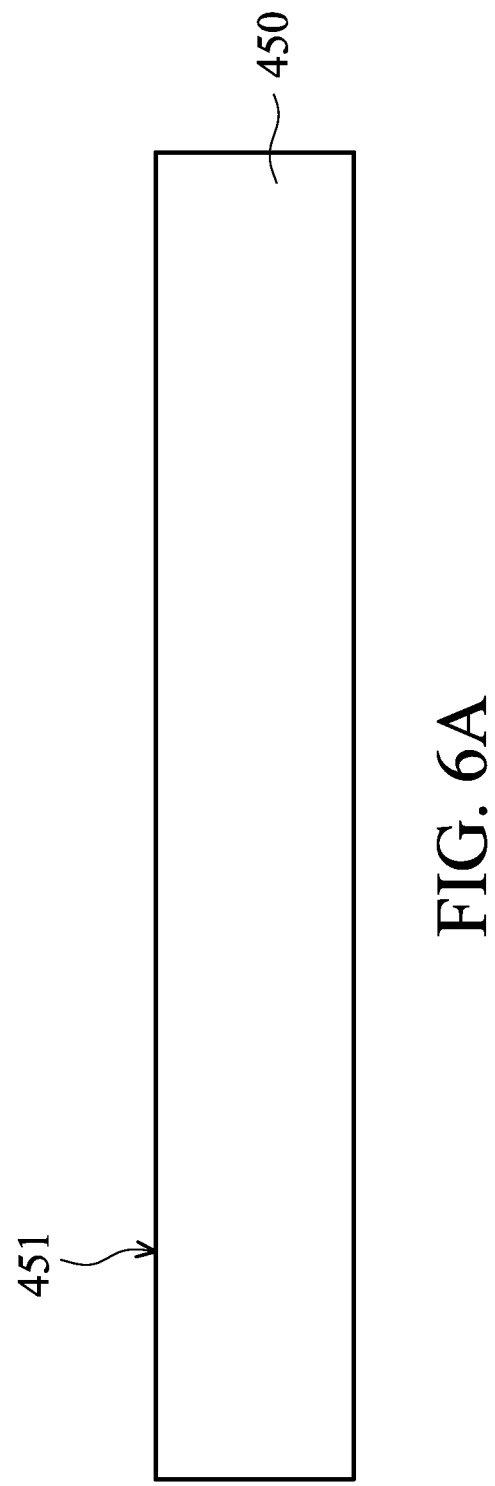
Figure 6C:
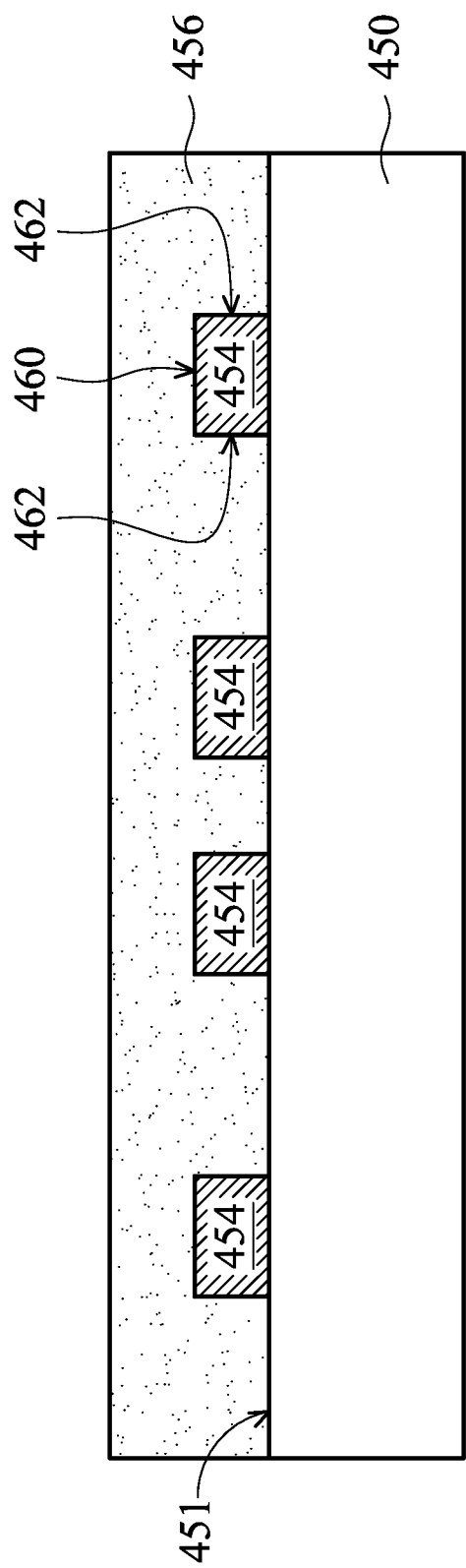
Figure 6D:
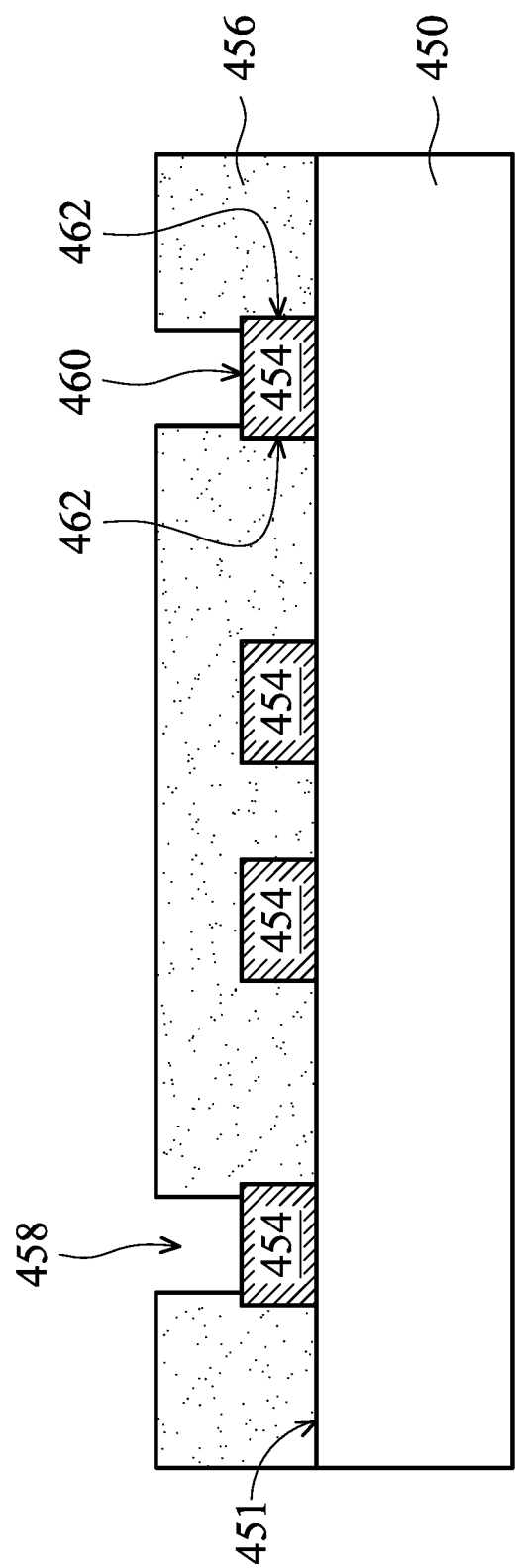
Figure 6E:
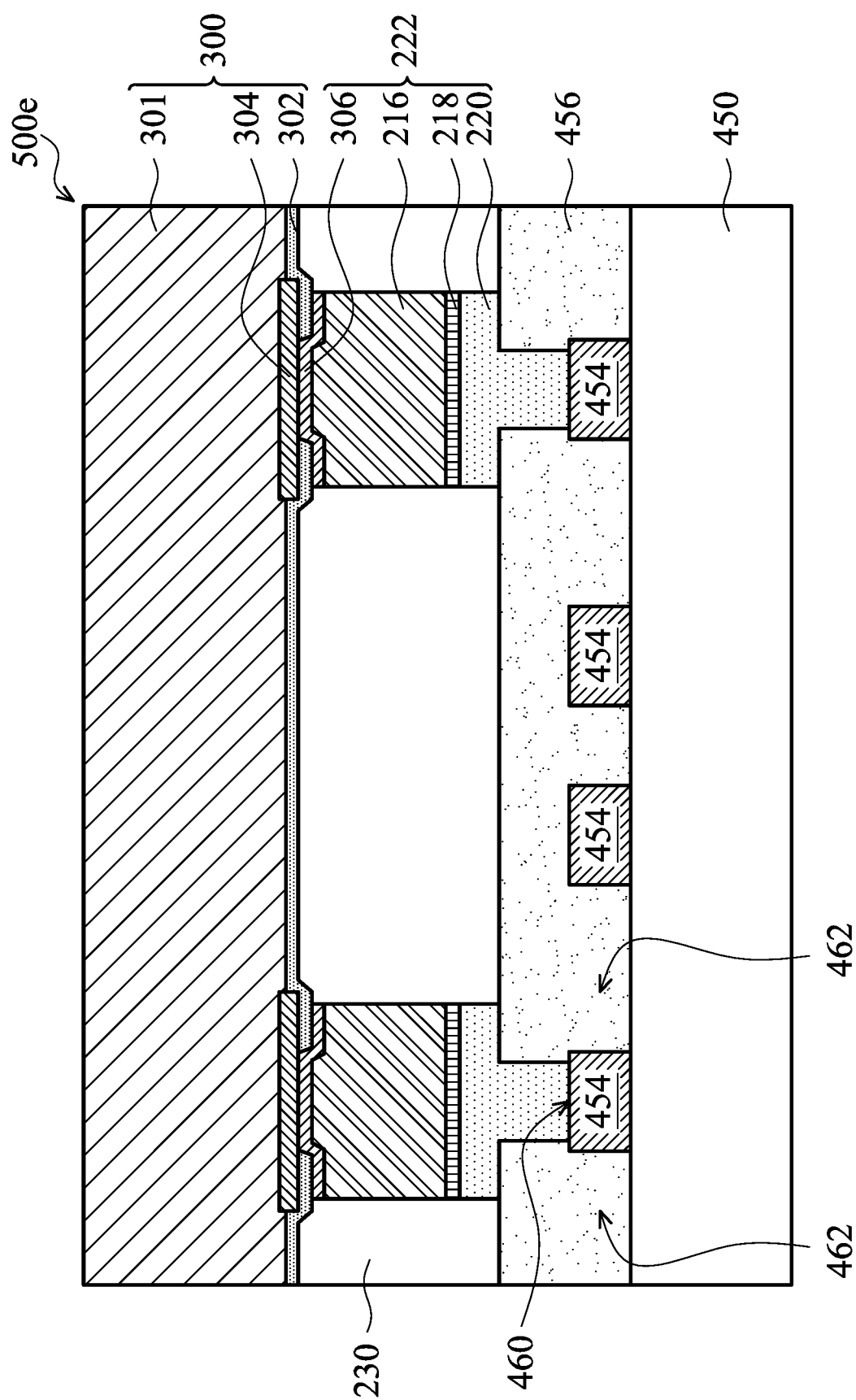

FIGS. 6A to 6E are cross-sectional views of various stages of a process for forming a semiconductor package, in accordance with some embodiments. Elements in FIGS. 6A to 6E that are the same as those in FIGS. 1 to 4 and 5A to 5E are labeled with the same reference numbers as in FIGS. 1 to 4 and 5A to 5E, and are not described again for brevity. FIG. 6E shows a semiconductor package 500e, in accordance with some embodiments.

As shown in FIG. 6A, a base 450 with a top surface 451 is provided. Next, as shown in FIG. 6B, at least one conductive trace 454 is formed on the top surface 451 of the base 450. In some embodiments, the conductive trace 454 may be formed by a plating process and an anisotropic etching process. In some embodiments, the plating process may comprise an electrical plating process. In some embodiments, the conductive trace 454 may comprise copper or another suitable material. In some embodiments, the conductive trace 454 is designed to have a width which is larger than 5 µm. However, it should be noted that there is no limitation on the width of the conductive traces. For different designs, the width of the conductive traces can be smaller than 5 µm if required. In some embodiments, the anisotropic etching process may precisely control the width of the conductive trace 454.

Next, as shown in FIG. 6C, a laminating process is performed to dispose an insulation material 456 on the top surface 451 of the base 450. The insulation material 456 covers a top surface 460 and sidewalls 462 of the conductive trace 454. In some embodiments, the base 450 and the insulation material 456 thereon collectively serve as a multilayer base.

Next, as shown in FIG. 6D, a drilling process is performed to form at least one opening 458 in the insulation material 456 to define the formation position of a subsequently formed conductive structure, for example, a copper bump structure or a solder bump structure. In some embodiments, the drilling process may comprise a laser drilling process, an etching drilling process or a mechanical drilling process. In some embodiments, the top surface 460 of the conductive trace 454 is exposed from the opening 458 of the insulation material 456.

Next, as shown in FIG. 6E, a bonding process is performed to mount a semiconductor device 300 on the base 450 through conductive structures 222. Elements of the semiconductor device 300 and the conductive structures 222 are the same as or similar to those in FIGS. 1 to 4. They are labeled with the same reference numbers as in FIGS. 1 to 4 and are not described again for brevity. After the bonding process, the conductive structures 222 extend into the opening 458 of the insulation material 456, and directly contact the top surface 460 of the conductive trace 454. Next, an underfill material 230 may be introduced into the gap between the semiconductor device 300 and the insulation material 456. In some embodiments, the underfill material 230 may comprises a CUF, MUF or a combination thereof. As a result, the base 450, the conductive trace 454, the insulation material 456, the semiconductor device 300, and the conductive structures 222 collectively form the semiconductor package 500e.

Embodiments of the disclosure provide a semiconductor package. The semiconductor package is designed to comprise conductive trace embedded in a base, for example a PCB. The conductive traces may have a top surface disposed above, below or aligned to a surface of the base to improve routing ability for high-density semiconductor packages. Also, the conductive traces are designed to have a width which is larger than 5 µm. Furthermore, the base may comprise a single layer structure or a multilayer structure. Exemplary embodiments also provide a method for fabricating a base for a semiconductor package. In some embodiments, the method can fabricate two bases on two sides of a carrier simultaneously. Also, the conductive traces may be embedded in the base. Furthermore, the conductive trace may be formed by a plating process and an anisotropic etching process, and the anisotropic etching process may precisely control the width of the conductive trace. Alternatively, the method can fabricate a base comprising a single layer structure or a multilayer structure to improve design capability.

Figure 7A:
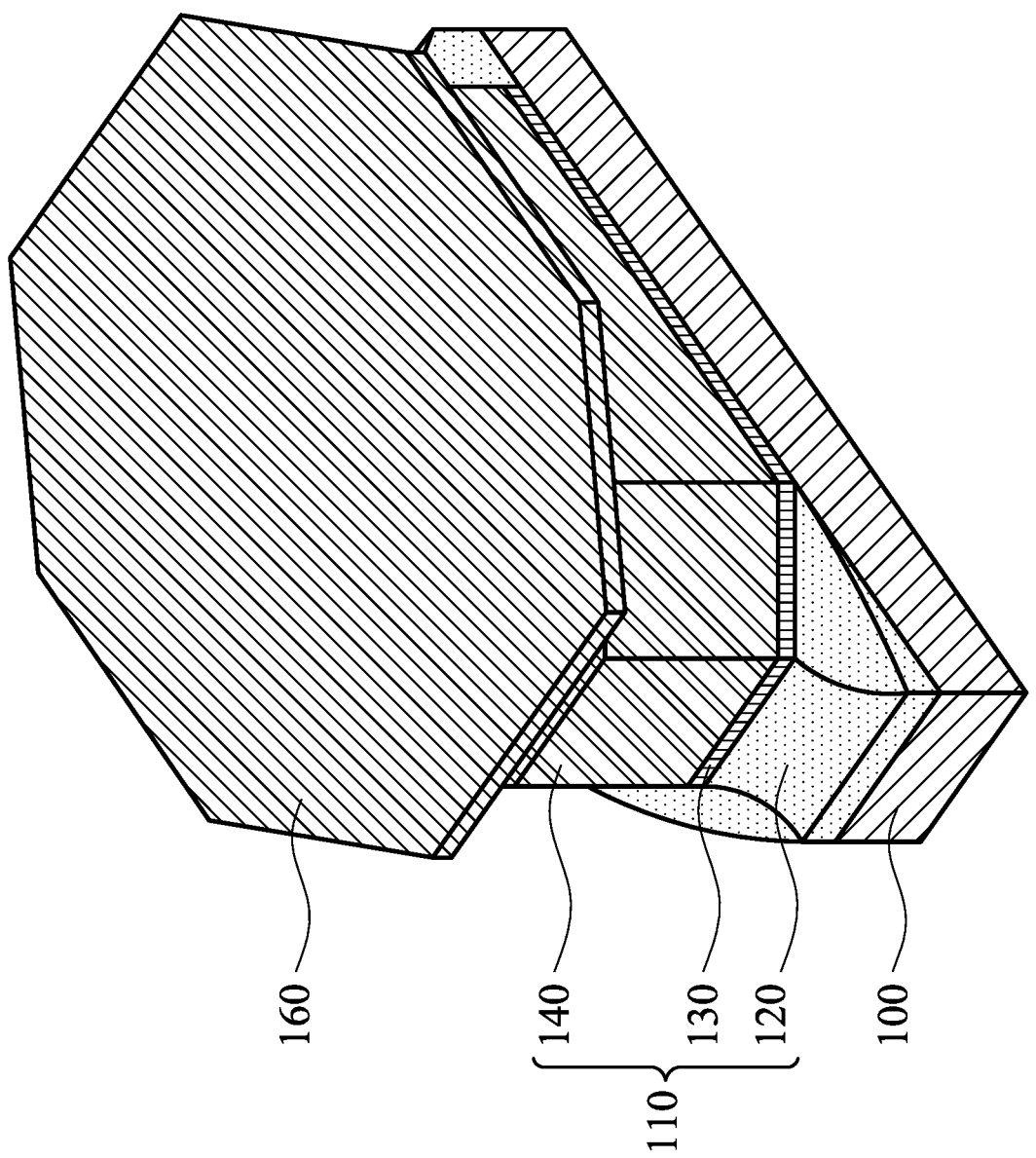
FIG. 7A is a perspective view of a portion of a semiconductor package, in accordance with some embodiments.
Figure 7B:
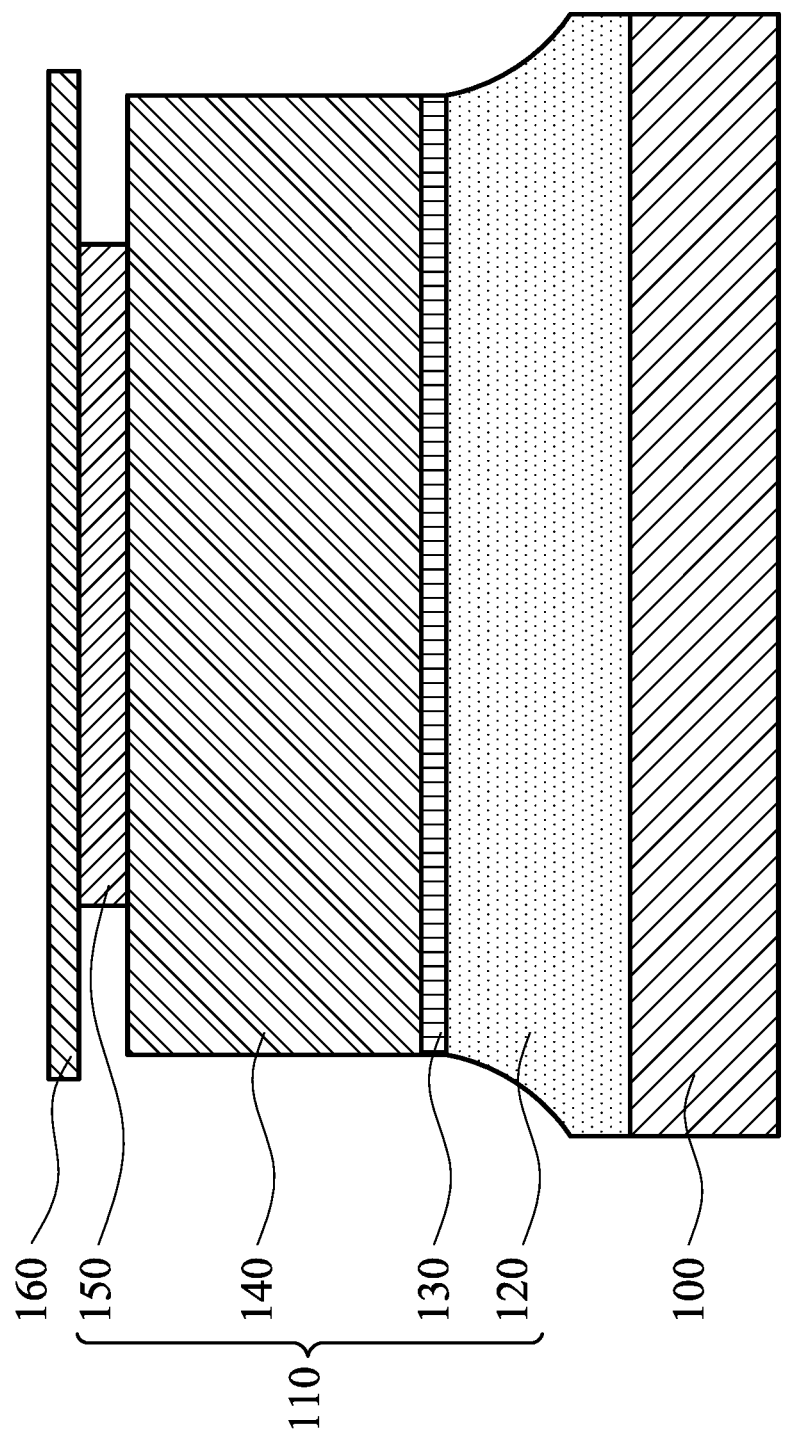
FIGS. 7B and 7C are cross-sectional views of a portion of a semiconductor package, in accordance with some embodiments.
Figure 7C:
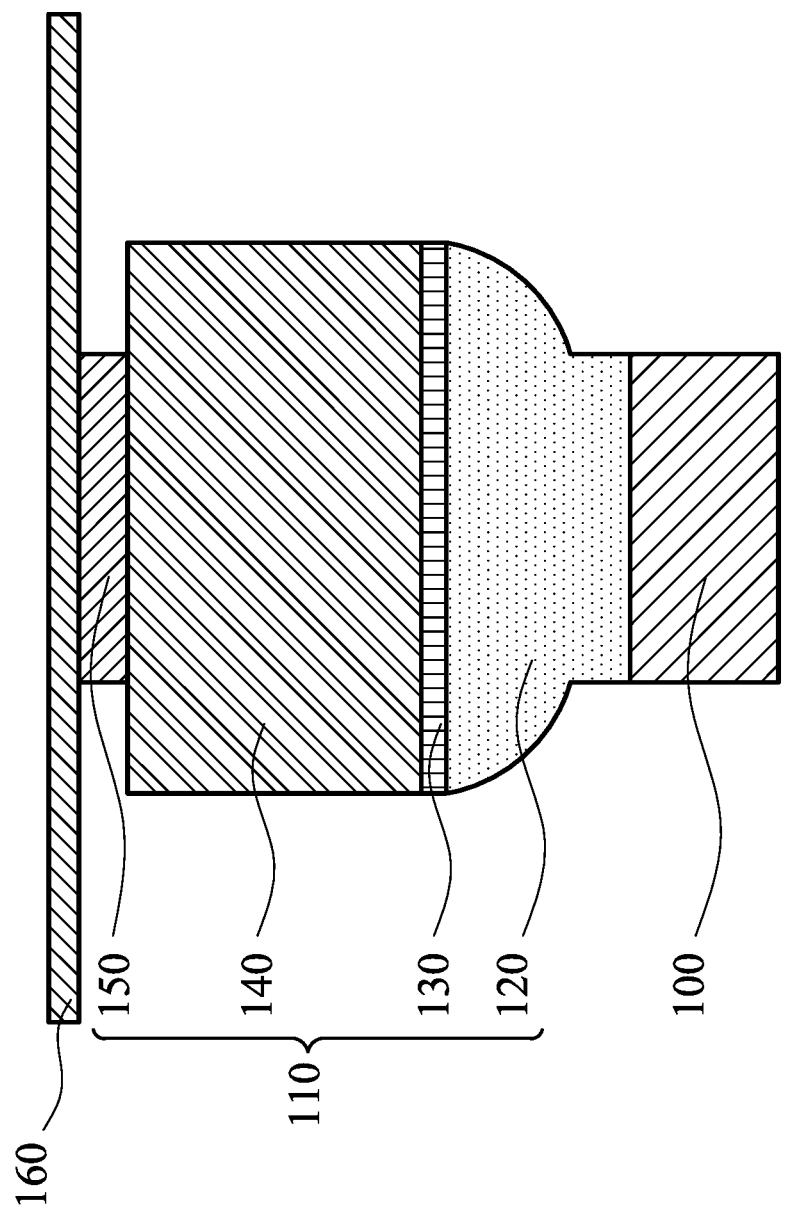

FIG. 7A is a perspective view of a portion of a semiconductor package, in accordance with some embodiments. FIGS. 7B and 7C are cross-sectional views of a portion of a semiconductor package, in accordance with some embodiments. The portion of a semiconductor package shown in FIGS. 7A to 7C may be a portion of the semiconductor package 500a, 500b, 500c, 500d or 500e.

FIGS. 7A to 7C show that a conductive trace 100 is an elongated line or stripe. Namely, the length of the conductive trace 100 is much greater than its width. In some embodiments, at least one portion of the conductive trace 100 is embedded in a base (not shown), such as the base 200, 200c or 200d. The conductive trace 100 has a portion serving as an external connecting region of the base. In some embodiments, the conductive trace 100 is the same as or similar to the conductive traces 202a, 202b, 202c, 202d, 404a, 404b or 454, and is not described again for brevity.

As shown in FIGS. 7A to 7C, a conductive structure 110 is disposed on a portion of the conductive trace 100 serving as the external connecting region. In some embodiments, the conductive structure 110 comprises a solder cap 120, a conductive buffer layer 130, a copper layer 140 and an UBM layer 150. In some embodiments, the solder cap 120, the conductive buffer layer 130 and the copper layer 140 are wider than the conductive trace 100. One or more of the solder cap 120, the conductive buffer layer 130, the copper layer 140 and the UBM layer 150 can be replaced or eliminated for different embodiments. Additional layers can be added to the conductive structure 110.

The solder cap 120 is sandwiched between the conductive trace 100 and the conductive buffer layer 130. The copper layer 140 is sandwiched between the conductive buffer layer 130 and the UBM layer 150. In some embodiments, the solder cap 120, the conductive buffer layer 130, the copper layer 140 and the UBM layer 150 are the same as or similar to the solder cap 220, the conductive buffer layer 218, the copper layer 216 and the UBM layer 306, respectively. Accordingly, they are not described again for brevity As shown in FIGS. 7A to 7C, a conductive structure 160 is disposed on the conductive structure 110. In some embodiments, the conductive structure 160 is a conductive pad. The conductive pad may be included in a topmost metal layer of an interconnection structure or a redistribution layer (RDL) structure. The conductive structure 160 may be the same as or similar to the conductive pads 304. In some embodiments, the shape of the conductive structure 160 is square or octagonal so the length of the conductive structure 160 is substantially the same as its width. In some embodiments, the conductive structure 160 is shorter than the conductive trace 100, as shown in FIG. 7B. In some embodiments, the conductive structure 160 is wider than the conductive trace 100, as shown in FIG. 7C. In some embodiments, the conductive trace 100 is distinct in shape and area compared to the conductive structure 160.

Figure 8A:
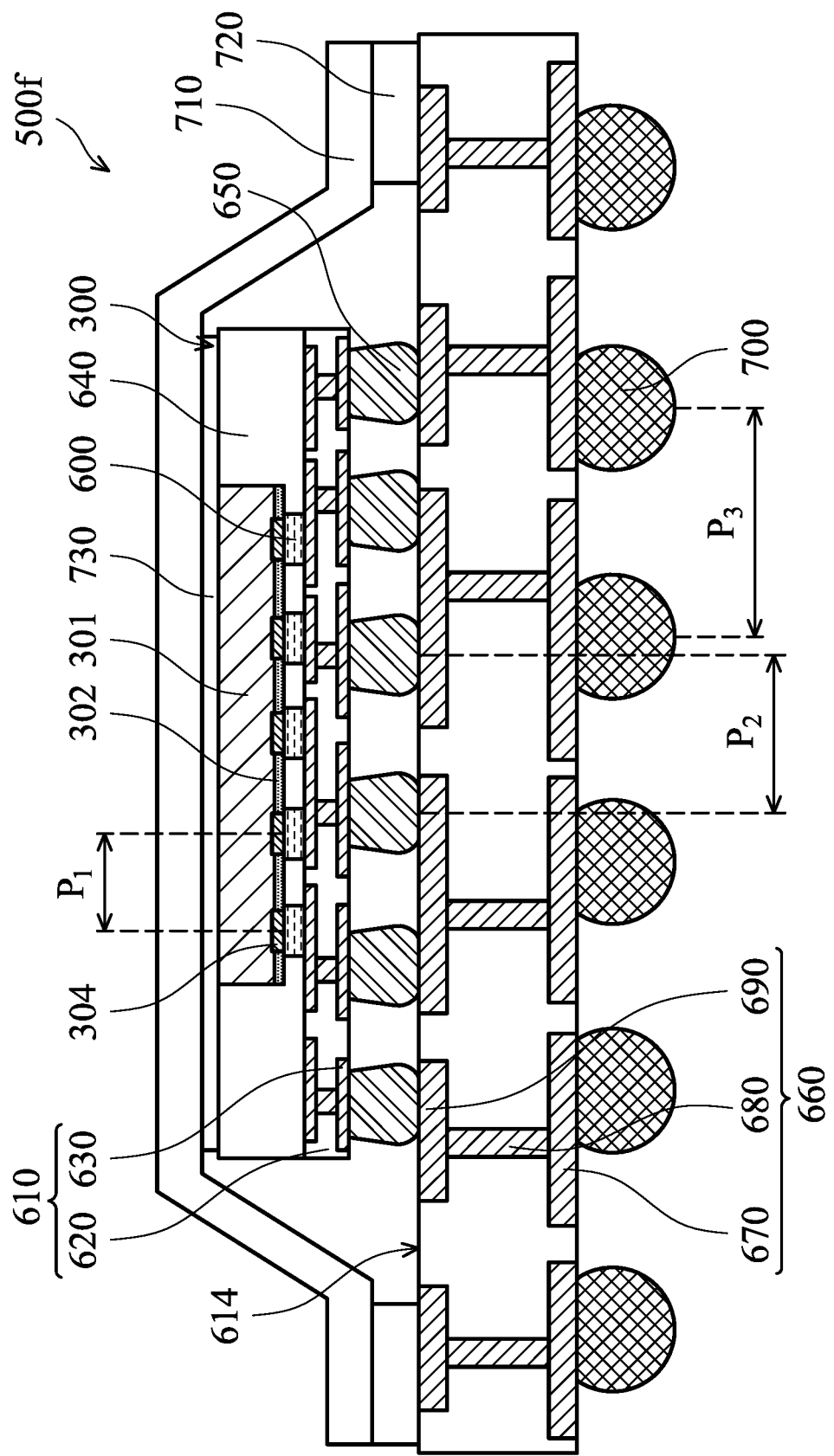
FIGS. 8A to 8D are cross-sectional views of various exemplary embodiments of a semiconductor package.

FIGS. 8A to 8D are cross-sectional views of various exemplary embodiments of a semiconductor package. As shown in FIG. 8A, a semiconductor package 500f comprises a semiconductor device 300, conductive structures 650, a base 660, and conductive structures 700. The semiconductor device 300 is a package and is mounted on a device-attached surface 614 of the base 660 using flip-chip technology. As a result, the semiconductor device 300 is electrically connected to the conductive structures 700 through the conductive structures 650 and the base 660. In some embodiments, the semiconductor device 300 may be mounted on the device-attached surface 614 of the base 660 using the same bonding process as mentioned above. That is to say, the semiconductor device 300 is bonded to conductive traces 690 embedded in the base 660 through the conductive structures 650.

As shown in FIG. 8A, the semiconductor device 300 comprises a semiconductor body 301, conductive structures 600, a carrier substrate 610 and a molding compound 640. In some embodiments, the semiconductor body 301 may include but is not limited to a semiconductor layer, circuit elements fabricated on the main surface of the semiconductor layer, ILD layers and an interconnection structure. In some embodiments, the interconnection structure may comprise conductive layers, dielectric layers alternatively laminated with the conductive layers and a plurality of vias formed through the dielectric layers on the semiconductor layer.

There are conductive pads 304 and an insulation layer 302 on an active surface of the semiconductor body 301. The active surface of the semiconductor body 301 faces the device-attached surface 614 of the base 660. The conductive pads 304 are included in a topmost layer of conductive layers of the interconnection structure. In some embodiments, the conductive pads 304 are the same as or similar to the conductive structure 160 shown in FIGS. 7A to 7C. In some embodiments, the conductive pads 304 may comprise but is not limited to aluminum, copper or alloys thereof. In some embodiments, the insulation layer 302 may be a single layer structure or a multilayer structure. In some embodiments, the insulation layer 302 may comprise but is not limited to silicon nitride, silicon oxide, silicon oxynitride, polyimide or any combination thereof. A plurality of openings may be formed in the insulation layer 302 to partially expose the conductive pads 304.

The conductive structures 600 connect the conductive pads 304 to the carrier substrate 610. The top surface of each conductive structure 600 is in contact with one of the conductive pads 304. The bottom surface of the conductive structures 600 is in direct contact with one of conductive traces in the carrier substrate 610. In some embodiments, the conductive structures 600 are conductive bumps, conductive pillars, conductive paste structures, or another suitable conductive structure. The conductive structures 600 may include solder, copper, or another suitable conductive material. In some embodiments, the conductive structures 600 are the same as or similar to the conductive structures 222 shown in FIGS. 1-4 or the conductive structures 110 shown in FIGS. 7A to 7C. For example, the conductive structures 600 may comprise a solder cap, a conductive buffer layer, a copper layer and an UBM layer. In some embodiments, the size of the conductive structures 600 is less than the size of the conductive structures 650. In some embodiments, the pitch $P_1$ between the conductive structures 600 is less than the pitch $P_2$ between the conductive structures 650.

The carrier substrate 610 is also referred to as a base, which is the same as or similar to the base 200 shown in FIGS. 1-4. In some embodiments, the semiconductor body 301 is mounted on the carrier substrate 610 using the same bonding process as mentioned above. That is to say, the semiconductor body 301 is bonded to conductive traces embedded in the carrier substrate 610 through the conductive structures 600. As a result, the bottom surface of the conductive structures 600 is in direct contact with the conductive trace embedded in the carrier substrate 610 without contacting a pad structure/portion.

In some embodiments, the carrier substrate 610 is an RDL structure. The carrier substrate 610 comprises one or more conductive traces 630 disposed in and surrounded by an inter-metal dielectric (IMD) layer 620. A topmost layer of the conductive traces 630 is electrically connected to the conductive structures 600. A bottommost layer of the conductive traces 630 is electrically connected to the conductive structures 650. The topmost layer of the conductive traces 630 is the same as or similar to the conductive traces 202a, 202b, 202c, 202d, 404a, 404b or 454. At least one portion of the conductive trace 630 is embedded in the carrier substrate 610. For example, a bottom surface of the conductive trace 630 is lower than the top surface of the carrier substrate 610, which faces the semiconductor body 301. Also, at least a lower part of a sidewall of the conductive trace 630 is immersed in the carrier substrate 610. The conductive traces 630 may comprise signal trace segments or ground trace segments. The signal trace segments or ground trace segments are used for I/O connections of the semiconductor body 301 mounted directly onto the carrier substrate 610.

In accordance with some embodiments, the topmost layer of the conductive traces 630 may have a top surface disposed above, below or aligned to the top surface of the carrier substrate 610. As a result, routing ability for high-density semiconductor packages can be greatly improved. In some embodiments, the width of the conductive traces 630 is less than that of the conductive pads 304, similar to the relation between the conductive trace 100 and the conductive structure 160 shown in FIGS. 7A to 7C. In some embodiments, the conductive traces 630 do not comprise a pad structure/portion. The conductive traces 630 are different from a pad structure in regard to shape, area, stress endurance, I/O density, and fabrication cost. However, in other embodiments, the conductive traces 630 comprise a pad portion applied for in direct contact with the bottom surface of the conductive structures 600.

The IMD layer 620 may include multiple sub-dielectric layers. To simplify the diagram, only a single dielectric layer is depicted herein as an example. In some embodiments, the IMD layer 620 may be formed of organic materials, which include a polymer base material, non-organic materials, which include silicon nitride ($SiN_x$), silicon oxide ($SiO_x$), graphene, or the like. In some embodiments, the IMD layer 620 is a high-k dielectric layer (k is the dielectric constant of the dielectric layer). In some other embodiments, the IMD layer 620 may be formed of a photosensitive material, which includes a dry film photoresist, or a taping film.

As shown in FIG. 8A, the carrier substrate 610 is wider than the semiconductor body 301, and the base 660 is wider than the carrier substrate 610. As a result, the circuitry of the semiconductor body 301 is connected to the conductive structures 700 by fanning out more than once (i.e., through the carrier substrate 610 and the base 660).

The molding compound 640 surrounds the semiconductor body 301 and the conductive structures 600. In some embodiments, the molding compound 640 is in direct contact with the conductive traces 630 of the carrier substrate 610. In some embodiments, the molding compound 640 is formed of a nonconductive material such as an epoxy, a resin, a moldable polymer, or another suitable molding material. In some embodiments, the molding compound 640 is applied as a substantial liquid, and then is cured through a chemical reaction. In some other embodiments, the molding compound 640 is an ultraviolet (UV) or thermally cured polymer applied as a gel or malleable solid, and then is cured through a UV or thermal curing process. The molding compound 640 may be cured with a mold.

In some embodiments, the conductive structures 650 are conductive bumps, conductive pillars, conductive paste structures, or another suitable conductive structure. The conductive structures 650 may include solder, copper, or another suitable conductive material. In some embodiments, the conductive structures 650 are the same as or similar to the conductive structures 110 or 222. For example, the conductive structures 650 may comprise a solder cap, a conductive buffer layer, a copper layer and an UBM layer.

In accordance with some embodiments, the base 660 is a PCB and may be formed of polypropylene (PP) with glass fiber, epoxy resin, polyimide, cyanate ester, another suitable material, or a combination thereof. In some embodiments, the base 660 is a multilayer structure, such two layers or four layers. The configuration of the base 660 shown in figures is only an example and is not a limitation to the present invention. It should be noted that the base 660 is not an Ajinomoto Build-Up Film (ABF) 1-2-1 substrate, in accordance with some embodiments. In some embodiments, the material of the base 660 is different from an Ajinomoto Build-Up Film so the base 660 costs less than an ABF 1-2-1 substrate.

The base 660 also comprises conductive traces 670 and conductive vias 680 between the conductive traces 670 and 690. The conductive vias 680 and the conductive traces 670 and 690 carry signals or ground across at least a portion of the base 660. The conductive structures 650 above the base 660 are electrically connected to the conductive structures 700 below the base 660 through the conductive traces 670 and 690 and the conductive vias 680. In some embodiments, one of the conductive vias 680 is sandwiched between one of the conductive traces 670 and one of the conductive traces 690. In some other embodiments, the base 660 further comprises one or more conductive traces between the conductive traces 670 and 690, and one of the conductive vias 680 penetrates all the conductive traces in the base 660.

The conductive structures 700 are bonded to a bottom surface of the base 660, which faces away from the carrier substrate 610 and is farther from the conductive traces 690 than the device-attached surface 614 of the base 660. In some embodiments, the conductive structures 700 are conductive bumps or another suitable conductive structure. The conductive structures 700 may include solder or another suitable material. In some embodiments, the size of the conductive structures 700 is greater than that of the conductive structures 650 and 600. In some embodiments, the pitch $P_3$ between the conductive structures 700 is greater than the pitch $P_2$ between the conductive structures 650. In some embodiments, the pitch $P_3$ is much greater than the pitch $P_1$ between the conductive structures 600.

In some embodiments, the ratio of the pitch $P_3$ to the pitch $P_1$ is much greater than 3, such as in a range from about 5 to about 9. In some embodiments, the ratio of the pitch $P_3$ to the pitch $P_2$ is greater than 1 and equal to or less than about 3. However, it should be noted that there is no limitation on the ratio. For different designs, the ratio of the pitch $P_3$ to the pitch $P_2$ can be greater than 3 if required.

In some embodiments, an underfill material (such as the underfill material 230 shown in FIGS. 1 to 4) may be disposed in the gap between the semiconductor device 300 and the base 660. The underfill material surrounds the conductive structures 650.

As shown in FIG. 8A, the semiconductor package 500f also comprises a heat slug 710, an adhesive layer 720, and a thermal interface material (TIM) 730. The heat slug 710 is attached on the device-attached surface 614 of the base 660 through the adhesive layer 720. As a result, the semiconductor device 300 is covered by the heat slug 710. In some embodiments, the adhesive layer 720 is in direct contact with one of the conductive traces 690 in the base 660.

The TIM 730 is between the semiconductor device 300 and the heat slug 710 to dissipate heat away from the semiconductor device 300. In some embodiments, the TIM 730 is sandwiched between a non-active surface of the semiconductor body 301 and the heat slug 710. In some other embodiments, the semiconductor package 500f may not comprise the heat slug 710, the adhesive layer 720 and/or the TIM 730.

Figure 8B:
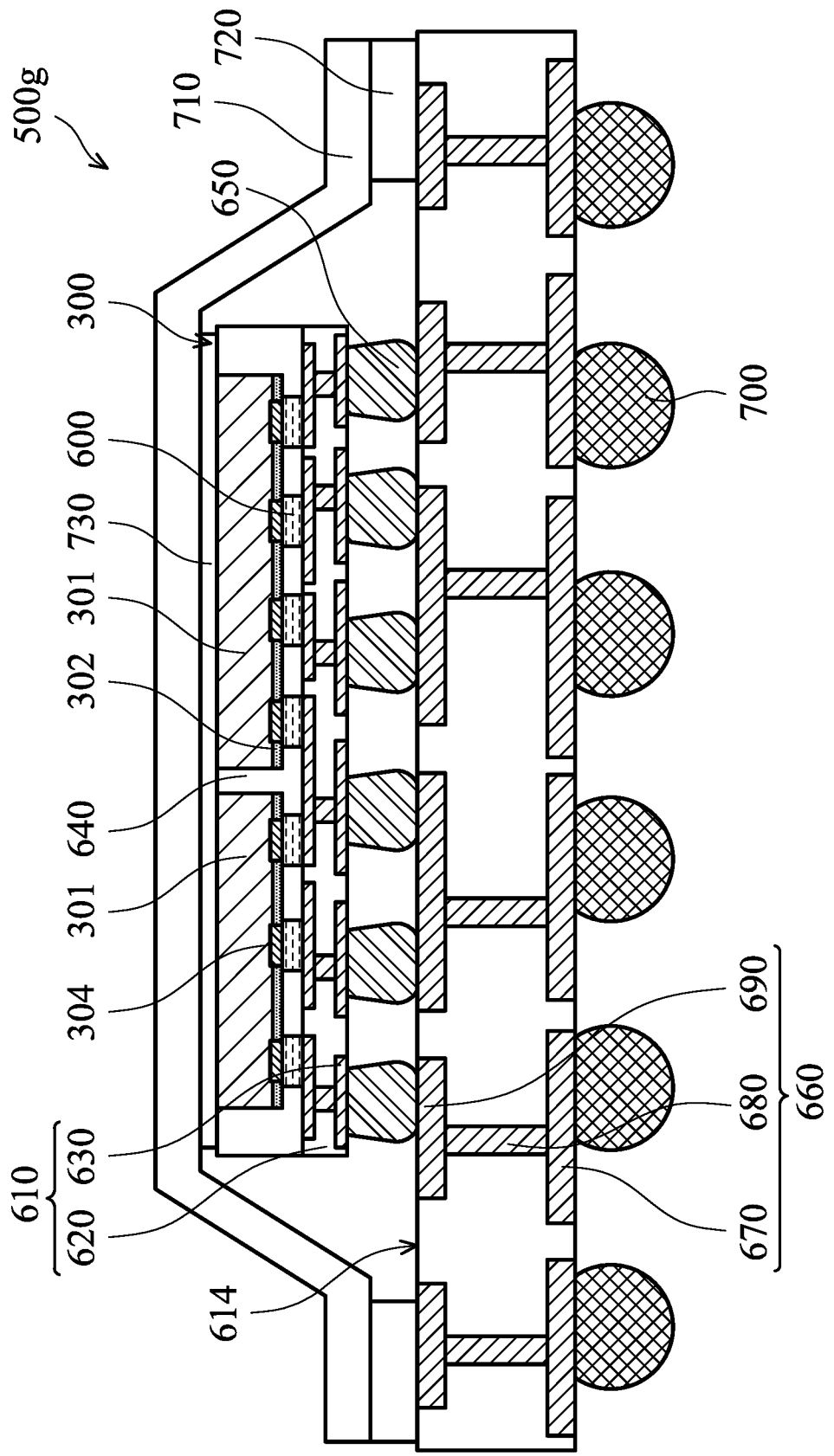

Although the embodiments shown in FIG. 8A provide a package including a semiconductor body 301, embodiments of the disclosure are not limited thereto. FIG. 8B shows a semiconductor package 500g similar to the semiconductor package 500f. Elements in FIG. 8B that are the same as those in FIG. 8A are labeled with the same reference numbers as in FIG. 8A, and are not described again for brevity.

As shown in FIG. 8B, the semiconductor device 300 comprises multiple semiconductor bodies 301. The semiconductor bodies 301 may be semiconductor dies with the same function or different functions. The semiconductor dies may be the same size or different sizes. The actual number, function and size of the semiconductor dies in the semiconductor device 300 are determined by design requirements and they are not limited. Alternatively, one of the semiconductor bodies 301 may be replaced by an integrated passive device (IPD), a capacitor, a resistor, an inductor, a varactor diode or another suitable passive component. The semiconductor bodies 301 are surrounded by the molding compound 640. The TIM 730 is between the semiconductor devices 300 and the heat slug 710 to dissipate heat away from the semiconductor devices 300.

Figure 8C:
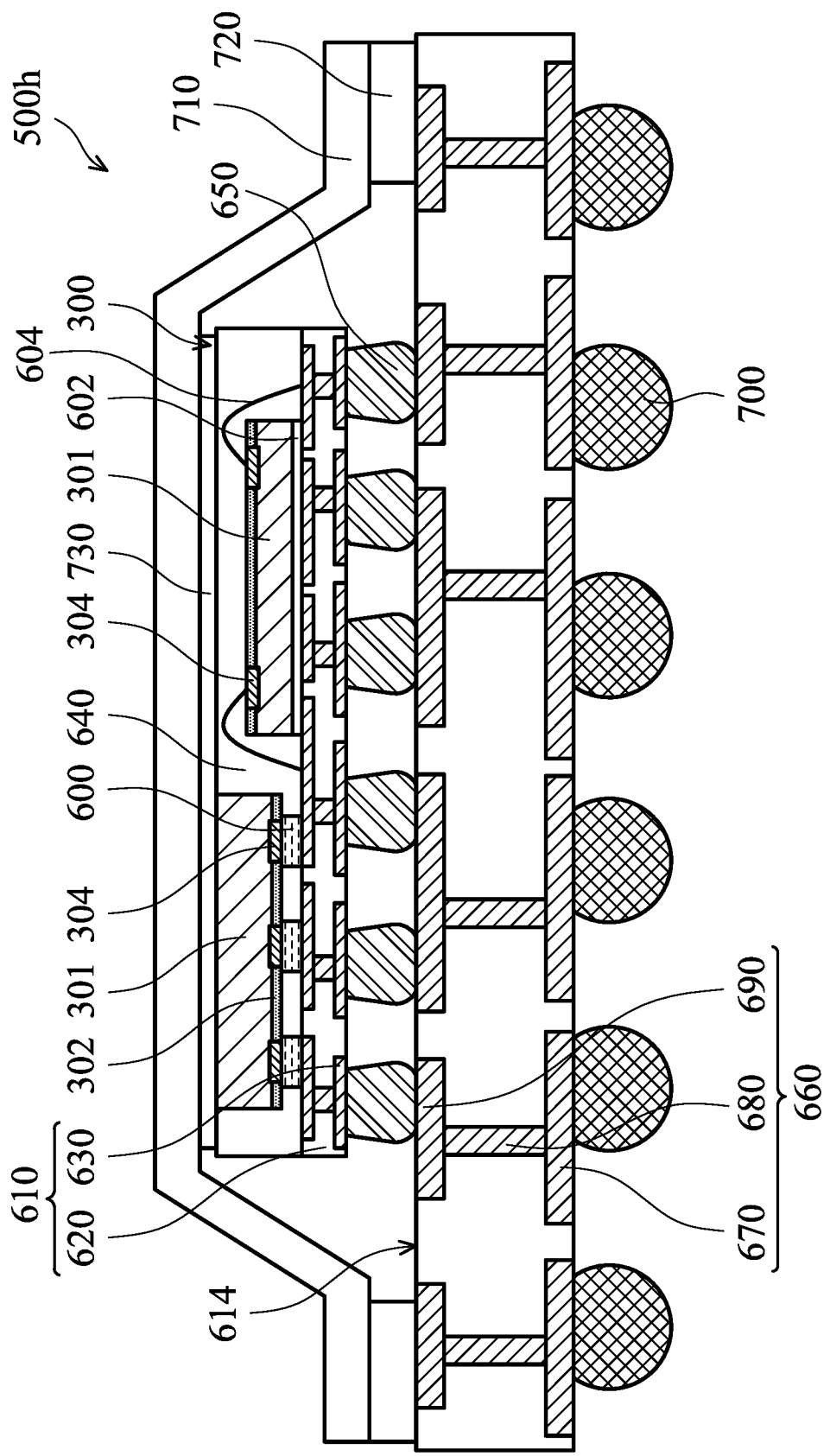

Many variations and/or modifications can be made to embodiments of the disclosure. FIG. 8C shows a semiconductor package 500h similar to the semiconductor package 500g. Elements in FIG. 8C that are the same as those in FIGS. 8A and 8B are labeled with the same reference numbers as in FIGS. 8A and 8B, and are not described again for brevity.

As shown in FIG. 8C, one of the semiconductor bodies 301 is flipped and its conductive pads 304 are electrically connected to the carrier substrate 610 through the conductive structures 600. Another of the semiconductor bodies 301 faces up and is attached onto the carrier substrate 610 through an adhesive layer 602. Also, its conductive pads 304 are electrically connected to the carrier substrate 610 through conductive structures 604, which is different from the conductive structures 600. For example, the conductive structures 600 are conductive pillars while the conductive structures 604 are bonding wires. The conductive structures 604 are enclosed by the molding compound 640. A portion of the molding compound 640 extends between one of the semiconductor bodies 301 and the TIM 730. The actual conductive structures for electrically connecting the conductive pads 304 and the carrier substrate 610 are determined by design requirements and they are not limited.

Figure 8D:
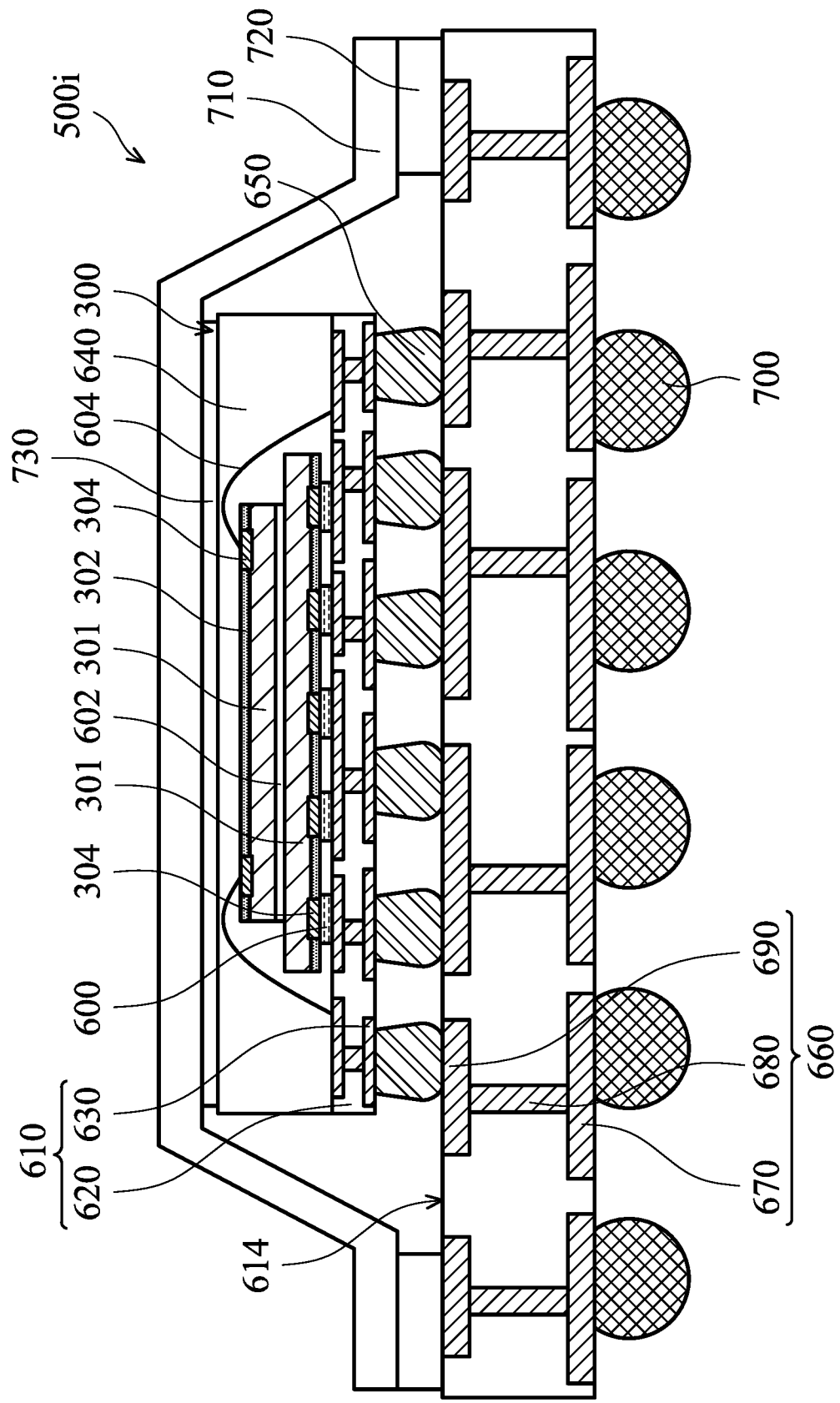

Although the embodiments shown in FIGS. 8B and 8C provide a package including multiple semiconductor bodies 301 positioned side by side, embodiments of the disclosure are not limited thereto. FIG. 8D shows a semiconductor package 500i similar to the semiconductor package 500h. Elements in FIG. 8D that are the same as those in FIGS. 8A to 8C are labeled with the same reference numbers as in FIGS. 8A to 8C, and are not described again for brevity.

As shown in FIG. 8D, the semiconductor device 300 comprises multiple vertically stacked semiconductor bodies 301. An underlying semiconductor body 301 is flipped and its conductive pads 304 are electrically connected to the carrier substrate 610 through the conductive structures 600. An overlying semiconductor body 301 faces up and is attached onto the underlying semiconductor body 301 through an adhesive layer 602. Also, its conductive pads 304 are electrically connected to the carrier substrate 610 through conductive structures 604, which is different from the conductive structures 600. For example, the conductive structures 600 are conductive pillars while the conductive structures 604 are bonding wires. The semiconductor bodies 301 are surrounded by the molding compound 640 and are separated from the TIM 730 by the molding compound 640. In some other embodiments, there may be no TIM between the semiconductor device 300 and the heat slug 710.

The semiconductor package in accordance with some embodiments of the disclosure provides various advantages. The semiconductor package includes a semiconductor device bonded on a base using flip-chip technology. The semiconductor device is a package. The package includes at least one semiconductor die and a fan out structure (such as a carrier substrate), which is positioned between the semiconductor die and the first conductive structures. In particular, the semiconductor die is bonded to conductive traces embedded in the fan out structure, rather than pad structures. The fan out structure electrically connects the semiconductor die to second conductive structures below the base through the first conductive structures. Due to the fan out structure, the pitch between the first conductive structures becomes larger. Also, the difference of the pitch between the second conductive structures and the pitch between the first conductive structures becomes less. As a result, the base is not limited to have small line widths and pitches. Design flexibility for the base is enhanced significantly. For example, the base can be a general and cheap substrate for PCB, rather than an expensive ABF 1-2-1 substrate. Accordingly, the fabrication cost of the base and the semiconductor package including the base can be reduced greatly. Embodiments of the disclosure provide a semiconductor package with improved integration flexibility and a lower fabrication cost.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
    a semiconductor device bonded to a base through a first conductive structure, wherein the semiconductor device comprises:
    a carrier substrate comprising a base material and a first conductive trace;
    a second conductive structure above the carrier substrate, wherein a portion of the second conductive structure is in direct contact with the first conductive trace and is below a portion of the base material;
    a semiconductor die mounted above the first conductive trace, wherein a pad of the semiconductor die is connected to the second conductive structure and is wider than the first conductive trace; and
    a molding compound surrounding the second conductive structure and in contact with the first conductive trace.

2. The semiconductor package as claimed in claim 1, wherein the carrier substrate is wider than the semiconductor die.

3. The semiconductor package as claimed in claim 1, wherein the base is wider than the carrier substrate.

4. The semiconductor package as claimed in claim 1, wherein the base comprises:
    a second conductive trace connecting to the first conductive structure;
    a third conductive trace connecting to a third conductive structure bonded to a surface of the base facing away from the carrier substrate; and
    a conductive via sandwiched between the third conductive trace and the second conductive trace.

5. The semiconductor package as claimed in claim 1, wherein a top surface of the first conductive trace is below a surface of the carrier substrate facing the pad.

6. The semiconductor package as claimed in claim 1, wherein a shape of the first conductive trace is different from that of the pad.

7. The semiconductor package as claimed in claim 1, wherein the second conductive structure comprises a copper layer and a solder cap, and the copper layer and/or the solder cap is wider than the first conductive trace.

8. A semiconductor package, comprising:
    a semiconductor device bonded to a base through a first conductive structure, wherein the semiconductor device comprises:
    a carrier substrate comprising a base material and a conductive trace, wherein a portion of the conductive trace is elongated;
    a second conductive structure above the carrier substrate, wherein a portion of the second conductive structure is in direct contact with the portion of the conductive trace and is below a portion of the base material;
    a semiconductor body mounted above the conductive trace, wherein the semiconductor body is connected to the second conductive structure; and
    a molding compound surrounding the second conductive structure and in contact with the conductive trace.

9. The semiconductor package as claimed in claim 8, wherein the molding compound surrounds the semiconductor body.

10. The semiconductor package as claimed in claim 8, wherein the conductive trace carries a signal or ground across at least a portion of the carrier substrate.

11. The semiconductor package as claimed in claim 8, wherein a top surface of the conductive trace is below a surface of the carrier substrate facing the semiconductor body.

12. The semiconductor package as claimed in claim 8, wherein the second conductive structure comprises a solder cap in contact with the portion of the conductive trace.

13. The semiconductor package as claimed in claim 8, wherein the portion of the conductive trace has a bottom surface and at least a portion of a sidewall connected to the base material.

14. The semiconductor package as claimed in claim 8, further comprising a third conductive structure bonded to a surface of the base facing away from the carrier substrate.

15. The semiconductor package as claimed in claim 14, wherein a size of the first conductive structure is greater than that of the second conductive structure and less than that of the third conductive structure.

16. A semiconductor package comprising:
a semiconductor device bonded to a base through a first conductive structures, wherein the semiconductor device comprises:
a carrier substrate comprising a base material and a conductive trace, wherein the conductive trace is elongated and carries a signal or ground across at least a portion of the carrier substrate;
second conductive structures above the carrier substrate, wherein one of the second conductive structures is in direct contact with the conductive trace and is below a portion of the base material;
a semiconductor die mounted above the conductive trace, wherein the semiconductor die is connected to the second conductive structures; and
a molding compound surrounding the second conductive structures and in contact with the conductive trace.

17. The semiconductor package as claimed in claim 16, wherein the carrier substrate is wider than the semiconductor die and narrower than the base.

18. The semiconductor package as claimed in claim 16, wherein an active surface of the semiconductor die faces the conductive trace.

19. The semiconductor package as claimed in claim 16, wherein the semiconductor device further comprises a second semiconductor die, wherein the semiconductor die and the second semiconductor die are positioned side by side or are vertically stacked.

20. The semiconductor package as claimed in claim 16, further comprising third conductive structures bonded to a bottom surface of the base which is farther from the conductive trace than a top surface of the base.

21. The semiconductor package as claimed in claim 20, wherein a pitch between the first conductive structures is greater than that between the second conductive structures and less than that between the third conductive structures.

22. The semiconductor package as claimed in claim 16, further comprising a heat slug attached to the base through an adhesive layer.

23. The semiconductor package as claimed in claim 22, further comprising a thermal interface material between the heat slug and the semiconductor die.

* * * * *